United States Patent [19]

Kawate

[11] Patent Number: 5,675,266
[45] Date of Patent: Oct. 7, 1997

[54] SIGNAL AMPLIFYING DEVICE

[75] Inventor: Masahiro Kawate, Nara-ken, Japan

[73] Assignee: Sharp Kabushiki Kaisha, Osaka, Japan

[21] Appl. No.: 669,582

[22] Filed: Jun. 24, 1996

Related U.S. Application Data

[63] Continuation of Ser. No. 607,418, Feb. 28, 1996, abandoned, which is a continuation of Ser. No. 183,997, Jan. 18, 1994, abandoned.

[30] Foreign Application Priority Data

Jan. 18, 1993 [JP] Japan .................................. 5-006280
Nov. 30, 1993 [JP] Japan .................................. 5-300538

[51] Int. Cl.⁶ ........................................... G01R 19/00
[52] U.S. Cl. .................................. 327/51; 327/112
[58] Field of Search ........................ 327/51–57, 65–67, 327/108, 111, 112, 185, 427; 365/185; 326/56, 57, 58

[56] References Cited

U.S. PATENT DOCUMENTS

| | | | |
|---|---|---|---|
| 4,616,148 | 10/1986 | Ochii et al. | 327/55 |
| 4,644,196 | 2/1987 | Flannagan | 326/57 |
| 4,697,112 | 9/1987 | Ohtani et al. | 327/55 |
| 4,877,978 | 10/1989 | Platt | 326/58 |
| 4,991,141 | 2/1991 | Tan | 327/54 |
| 5,067,109 | 11/1991 | Kim et al. | 326/58 |
| 5,132,576 | 7/1992 | Park | 327/51 |
| 5,343,428 | 8/1994 | Pilo et al. | 327/55 |

FOREIGN PATENT DOCUMENTS 3-21998  3/1991  Japan .

*Primary Examiner*—Toan Tran
*Attorney, Agent, or Firm*—Morrison & Foerster LLP

[57] ABSTRACT

A signal amplifying device including a sense amplifier for receiving first and second signals having respective logical levels from memory cells, and for, when activated in response to an actuating signal, outputting third and fourth signals having respective logical levels in accordance with the logical levels of the first and second signals; and output means for receiving the actuating signal, and the third and fourth signals, and for outputting an output signal having a logical level in accordance with a combination of the actuating signal and the logical levels of the third and fourth signals.

6 Claims, 10 Drawing Sheets

SIGNAL AMPLIFYING DEVICE

This is a File Wrapper continuation of application Ser. No. 08/607,418 filed Feb. 28, 1996 now abandoned which is a continuation of application Ser. No. 08/183,997 filed Jan. 18, 1994 now abandoned.

BACKGROUND OF THE INVENTION

1. Field of the Invention

The invention relates to a signal amplifying device, in particular to a signal amplifying device in which data signals read out from a memory cell of a semiconductor memory device onto a data line pair are amplified for output.

2. Description of the Related Art

In order to reduce the effect on an output signal which is due to a noise generated in the vicinity of a sense amplifier of a semiconductor memory device, a signal amplifying device having two sense amplifiers and two output lines which are respectively connected to the two sense amplifiers is disclosed in Japanese Patent Publication No. 3-21998. FIG. 10 is a circuit diagram showing the configuration of the signal amplifying device. In the signal amplifying device, a pair of bit lines 5 and 50 are connected to two sense amplifiers 41 and 410, respectively. The sense amplifiers 41 and 410 output signals having logical levels which are complementary to each other, through output lines 6 and 60 to two transistors $Q_{21}$ and $Q_{22}$ of an output circuit 47, respectively. When a noise is induced on one of the two output lines 6 and 60, a noise having the same phase is induced on the other output line. However, the output circuit 47 is configured so as to output a signal when signals sent from the two output lines 6 and 60 are complementary to each other, and difficult to react to in-phase signal components.

Recently, as the signal processing speed of signal amplifying devices of a semiconductor memory devices are increased, noises entering into an input signal, and self-generating noises owing to the trigger operation of an output buffer are increased. Noises which are originally to cancel each other because they have in-phase components may cause the potentials of the output lines 6 and 60 to be reduced to a level at which the potentials are judged to be the same logical level. Further, whisker-like noises pulses are generated in an actuating signal SE of the sense amplifier 41, whereby the sense amplifier may be caused to erroneously operate. When such noises are generated, there arise the following problems (1) to (3) in a conventional semiconductor memory device:

(1) When a noise causes the potentials of the output lines 6 and 60 to be reduced during the operative period of the sense amplifiers 41 and 410 and the output circuit 47 judges that the both potentials are low, the two transistors $Q_{21}$ and $Q_{22}$ of the output circuit 47 are turned ON so that a large amount of current flows through the transistors.

(2) During the read waiting period, the bit lines 5 and 50 are maintained at a high level. When the actuating signal SE is caused to become active by a noise during the inoperative period of the sense amplifiers 41 and 410, the potentials of both the output lines 6 and 60 become low level so that a large amount of current flows through the output circuit 47. On such an occasion, the sense amplifiers 41 and 410 cannot stably operate. Consequently, incorrect data may be output on the output lines 6 and 60.

(3) The internal synchronization system recently can be used in a semiconductor memory device. In the device, the sense amplifiers 41 and 410 operate for a fixed period on the basis of a synchronizing signal generated by an external signal (an address signal, or the like). In such a case, data output from the output circuit 47 is latched in a latch circuit, and the sense amplifiers 41 and 410 are thereafter turned to an inactive state. In a semiconductor memory device using the internal synchronization system, when the sense amplifiers 41 and 410 are caused to output incorrect data by a noise as described in (2) above, the incorrect data is latched in the latch circuit, thereby producing a problem that the correct data cannot be output.

SUMMARY OF THE INVENTION

A signal amplifying device of this invention comprises: a sense amplifier for receiving first and second signals having respective logical levels from memory means, and for, when activated in response to an actuating signal, outputting third and fourth signals having respective logical levels in accordance with the logical levels of the first and second signals; and output means for receiving the actuating signal, and the third and fourth signals, and for outputting an output signal having a logical level in accordance with a combination of the actuating signal and the logical levels of the third and fourth signals.

According to another aspect of the invention, a signal amplifying device comprises: a sense amplifier, connected to a memory cell through a pair of signal lines, for receiving a first signal for selecting one of an activated and a deactivated state of the sense amplifier, and for outputting signals each having a logical level from a pair of output terminals in accordance with a potential difference between the pair of signal lines; and three-state output means for, when logical levels of the signals output from the pair of output terminals of the sense amplifier are different from each other under a state where the sense amplifier is activated, outputting a signal having a logical level which corresponds to the logical levels of the signals output from the pair of output terminals, for, when logical levels of both the signals output from the pair of output terminals of the sense amplifier are identical each other under a state where the sense amplifier is activated, setting an output to a high impedance, and for, also under a state where the sense amplifier is deactivated, setting an output to a high impedance.

According to still another aspect of the invention, a signal amplifying device comprises: a sense amplifier, connected to a memory cell through a pair of signal lines, for receiving a first signal for selecting one of an activated and a deactivated state of the sense amplifier, and for outputting signals having a logical level from a pair of output terminals in accordance with a potential difference between the pair of signal lines; a pair of pull-up means, respectively connected to the pair of output terminals of the sense amplifier, for pulling up levels of the signals output from the pair of output terminals in accordance with the first signal; and three-state output means for, when logical levels of the signals output from the pair of output terminals of the sense amplifier are different from each other under a state where the sense amplifier is activated, outputting a signal having a logical level which corresponds to the logical levels of the signals output from the pair of output terminals, for, when logical levels of both the signals output from the pair of output terminals of the sense amplifier are at a high level under a state where the sense amplifier is activated, setting an output to a high impedance, and for, also under a state where the sense amplifier is deactivated, setting an output to a high impedance.

According to still another aspect of the invention, a signal amplifying device comprises: a sense amplifier, connected to a memory cell through a pair of signal lines, for receiving a signal for selecting one of an activated and a deactivated state of the sense amplifier, and for outputting signals having a logical level from a pair of output terminals in accordance with a potential difference between the pair of signal lines; a pair of load means respectively connected between each one of the pair of signal lines and a power source; and three-state output means for, when logical levels of the signals output from the pair of output terminals of the sense amplifier are different from each other under a state where the sense amplifier is activated, outputting a signal having a logical level which corresponds to the logical levels of the signals output from the pair of output terminals, for, when logical levels of both the signals output from the pair of output terminals of the sense amplifier are at a low level under a state where the sense amplifier is activated, setting an output to a high impedance, and for, also under a state where the sense amplifier is deactivated, setting an output to a high impedance.

It is an object of the invention to provide a signal amplifying device which is hard to erroneously operate and prevented from outputting incorrect data, even when there arises an abnormal state in a signal input into or output from a sense amplifier, or in an actuating signal of the sense amplifier.

According to the signal amplifying device of the invention, when two outputs of a sense amplifier have the same logical level, the output state of output means can surely be set to a high-impedance state.

Even when both the two outputs of a sense amplifier are caused to have the same logical level by a noise during the operative period of the sense amplifier, a large amount of current is prevented from flowing through all of the transistors of the output means. Further, even when an actuating signal of the sense amplifier is caused to become active by a noise during the inoperative period of the sense amplifier, a large amount of current between a ground and a power source is prevented from flowing through the output means.

Moreover, according to the signal amplifying device of the invention, when the actuating signal of the sense amplifier is inactive, both the two outputs of the sense amplifier are maintained at a high level by the pull-up circuit. When both the two outputs become high, the output state of the output means can surely be set to a high-impedance state. Therefore, even when the actuating signal of the sense amplifier becomes inactive during the operative period of the sense amplifier, both the two outputs of the sense amplifier can be set to a high level, whereby the output state of the output means can surely be set to a high-impedance state. Moreover, even when the two outputs of the sense amplifier are set to a high level by a noise during the operative period of the sense amplifier, a large amount of current is prevented from passing through the output means. Furthermore, even in the case where the actuating signal of the sense amplifier is caused to become active by a noise during the inoperative period of the sense amplifier, as the period of the active state of the actuating signal is short, the high-impedance state of the output means is not canceled because the two outputs of the sense amplifier has been maintained at a high level by the pull-up circuit. This can prevent a large amount of current from flowing through the output means, and the output means does not output incorrect data.

According to the signal amplifying device of the invention, as the bit line pair is set to a high level during the read waiting period, two P-channel transistors of the input portion of the sense amplifier can surely be turned OFF. Even when the actuating signal of the sense amplifier is caused to become active by a noise during the inoperative period of the sense amplifier, accordingly, noninverted output and inverted output from the sense amplifier can surely be maintained at a low level, thereby preventing incorrect data from being output from the output means. Furthermore, since this enables the output state of the output means to be set to a high-impedance state, a large amount of current is prevented from flowing through all of the transistors in the output means. Therefore, even when the two outputs of the sense amplifier are set to a low level by a noise during the operative period of the sense amplifier, a large amount of current does not flow from a power source to a ground through the plurality of transistors in the output means.

These and other advantages of the present invention will become apparent to those skilled in the art upon reading and understanding the following detailed description with reference to the accompanying figures.

DESCRIPTION OF THE PREFERRED EMBODIMENTS

Hereinafter, embodiments of the invention will be described. In the description of the embodiments, a high level means the High level of the logical levels, and a low level means the Low level of the logical levels. In truth tables used in the following description, "H" indicates the high level, "L" indicates the low level, and "HiZ" indicates a high-impedance state.

Figure 1:
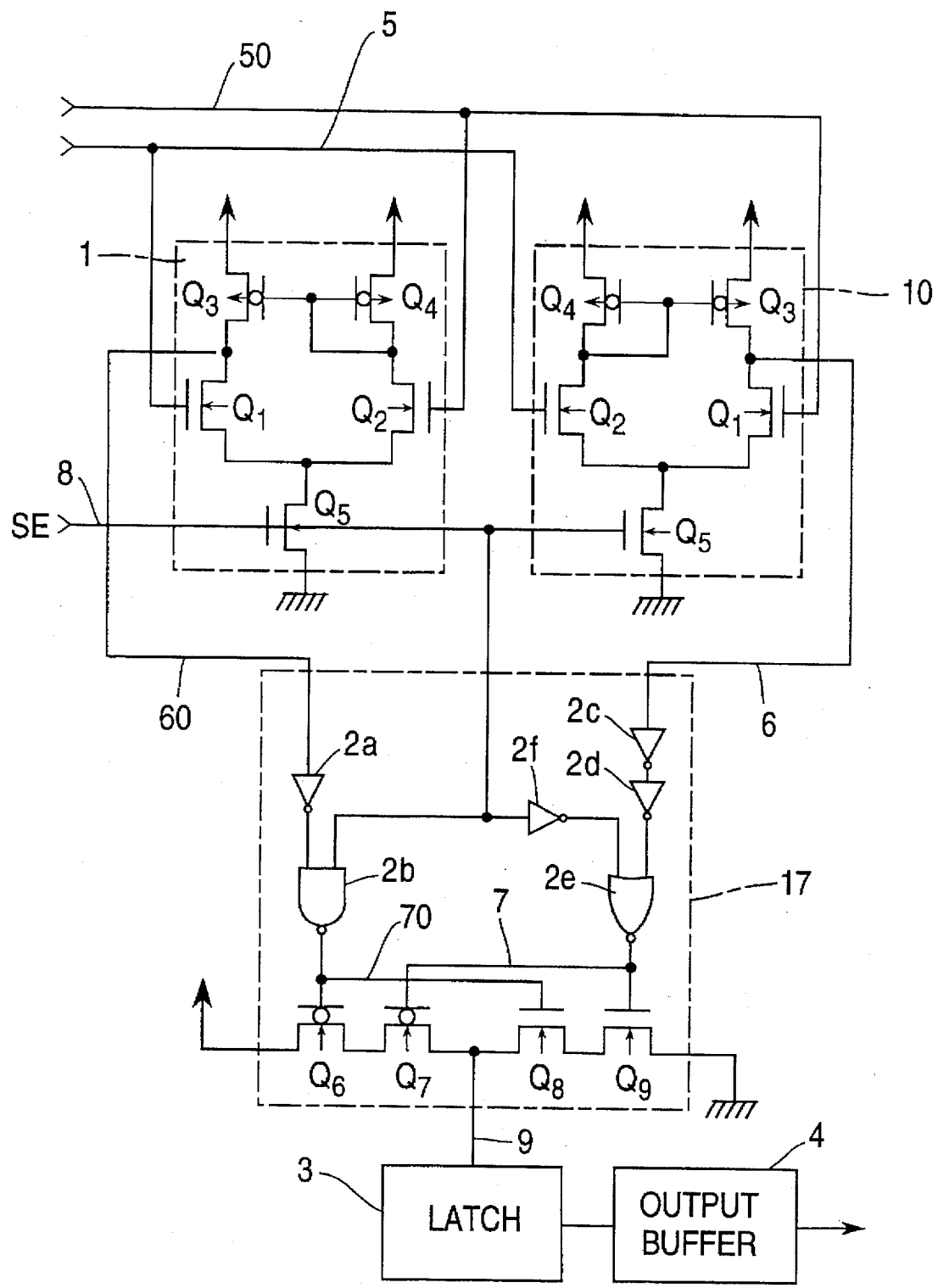
FIG. 1 is a schematic diagram showing a circuit of a first embodiment of the invention.
Figure 10:
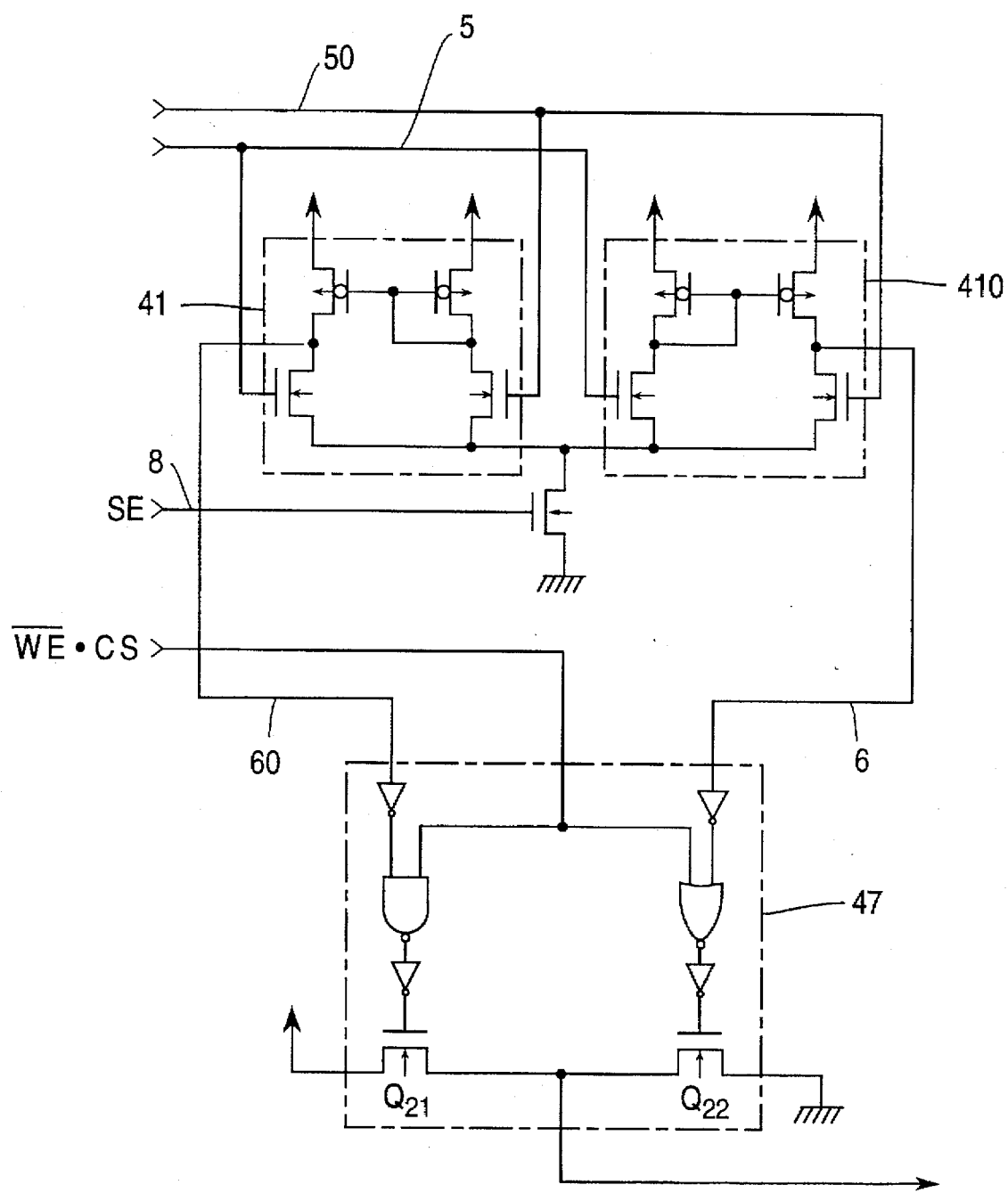
FIG. 10 is a schematic diagram showing a circuit for a conventional signal amplifying device.

FIG. 1 is a schematic diagram showing a circuit of a first embodiment of the invention. In FIG. 1, components having the same function as those of the conventional signal amplifying device of FIG. 10 are indicated by the same reference numbers.

The signal amplifying device of the first embodiment comprises two sense amplifiers 1 and 10, a three-state output circuit 17, a latch circuit 3, and an output buffer 4. Each of the sense amplifiers 1 and 10 comprises two P-channel transistors $Q_3$ and $Q_4$, and three N-channel transistors $Q_1$, $Q_2$, and $Q_5$. The three-state output circuit 17 comprises two P-channel transistors $Q_6$ and $Q_7$, two N-channel transistors $Q_8$ and $Q_9$, four inverters 2a, 2c, 2d, and 2f, a NAND circuit 2b, and a NOR circuit 2e.

In each of the sense amplifiers 1 and 10, the P-channel transistors $Q_3$ and $Q_4$ (hereinafter, the transistors used in the first embodiment are often indicated only by the respective reference numbers) constitute a current mirror circuit. The gate of $Q_3$ is connected to the gate and source of $Q_4$. The drains of the two transistors $Q_3$ and $Q_4$ are connected to a power source which is not shown in FIG. 1. The sources of the two transistors $Q_3$ and $Q_4$ are connected to the drains of the two transistors $Q_1$ and $Q_2$, respectively. The sources of both the two transistors $Q_1$ and $Q_2$ are connected to the drain of $Q_5$. The source of $Q_5$ is grounded.

The sense amplifiers 1 and 10 are connected through a pair of signal lines 5 and 50 to a memory cell which is not shown in the figure. The signal lines 5 and 50 are a pair of complementary bit lines through which a data read out from the memory cell is input into the sense amplifiers 1 and 10. The bit line 5 is connected to the gates of $Q_1$ of the sense amplifier 1 and $Q_2$ of the sense amplifier 10, and the bit line 50 is connected to the gates of $Q_2$ of the sense amplifier 1 and $Q_1$ of the sense amplifier 10. A sense amplifier output line 60 is connected to the drain of $Q_1$ of the sense amplifier 1, and a sense amplifier output line 6 is connected to the drain of $Q_1$ of the sense amplifier 10. An actuating signal line 8 is connected to the gates of the transistors $Q_5$ of the sense amplifiers 1 and 10.

In the three-state output circuit 17, the four transistors $Q_6$, $Q_7$, $Q_8$, and $Q_9$ are connected in the following manner: The drain of $Q_6$ is connected to a power source, and the source of $Q_6$ is connected to the drain of $Q_7$. The source of $Q_7$ is connected to the drain of $Q_8$. The source of $Q_8$ is connected to the drain of $Q_9$, and the source of $Q_9$ is grounded. The transistors $Q_6$ and $Q_8$ constitute an inverter circuit, and $Q_7$ and $Q_9$ constitute another inverter circuit.

The drain of $0_1$ of the sense amplifier 1 is connected to the input of the inverter 2a through the sense amplifier output line 60. The output of the inverter 2a is connected to the first input of the NAND circuit 2b. The gates of the transistors $Q_5$ of the sense amplifiers 1 and 10 are connected through the actuating signal line 8 to the input of the inverter 2f and the second input of the NAND circuit 2b. The output of the NAND circuit 2b is connected to the gates of $Q_6$ and $Q_8$. The output of the inverter 2f is connected to the first input of the NOR circuit 2e. The drain of $Q_1$ of the sense amplifier 10 is connected to the input of the inverter 2c through the sense amplifier output line 6. The output of the inverter 2c is connected to the input of the inverter 2d. The output of the inverter 2d is connected to the second input of the NOR circuit 2e. The output of the NOR circuit 2e is connected to the gates of $Q_7$ and $Q_9$. The source of $Q_7$ is connected to the input of the latch circuit 3, and the output of the latch circuit 3 is connected to the input of the output buffer 4.

When an actuating signal SE to the sense amplifiers 1 and 10 is at a high level, the transistors $Q_5$ of both the sense amplifiers 1 and 10 are turned ON. The sense amplifiers 1 and 10 are activated when the actuating signal SE is at a high level, and deactivated when the actuating signal SE is at a low level. When data of the memory cell is output to the sense amplifiers 1 and 10 through the bit lines 5 and 50, the minute potential difference between the bit lines 5 and 50 is differentially amplified by the sense amplifiers 1 and 10. In accordance with the input data, the sense amplifiers 1 and 10 output logical levels which are complementary to each other, to the sense amplifier output lines 6 and 60. During the read wait period when the data read out operation is not conducted, both the bit lines 5 and 50 are maintained at a high level.

The actuating signal SE is input into the second input of the NAND circuit 2b, and the signal having a logical level which is obtained by inverting that of the actuating signal SE is input into the first input of the NOR circuit 2e through the inverter 2f. The threshold voltages of the inverters 2c and 2a connected to the sense amplifier output lines 6 and 60 are set to a higher level than that which is usually used. The signal output from the source of $Q_7$ and the drain of $Q_8$ is a signal which is output from the three-state output circuit 17 to the latch circuit 3. The output signal from the three-state output circuit 17 is output to the output buffer 4 through the latch circuit 3. The latch circuit 3 is a circuit which temporally stores data, and the output buffer 4 is a circuit which outputs the latched data.

The case where the actuating signal SE is at a high level and the potential of the bit line 5 is higher than that of the bit line 50 is designated as the first case.

In the first case, the gate potentials of $Q_1$ of the sense amplifier 1 and $Q_2$ of the sense amplifier 10 are higher than those of $Q_2$ of the sense amplifier 1 and $Q_1$ of the sense amplifier 10. In the first case, since the conductivities of $Q_1$ of the sense amplifier 1 and $Q_2$ of the sense amplifier 10 are higher than those of $Q_2$ of the sense amplifier 1 and $Q_1$ of the sense amplifier 10, the drain potential of $Q_1$ of the sense amplifier 1 becomes lower than that of $Q_2$ of the sense amplifier 1, and the drain potential of $Q_1$ of the sense amplifier 10 becomes higher than that of $Q_2$ of the sense amplifier 10. In each of the sense amplifiers 1 and 10, conductivities of $Q_3$ and $Q_4$ are changed by the drain potential of $Q_2$, and a current is supplied to $Q_1$ and $Q_2$ through $Q_3$ and $Q_4$. The current mirror circuit consisting of $Q_3$ and $Q_4$ operates in the same manner also in the second, third, and fourth cases which will be described below.

In the first case, the drain potential of $Q_1$ of the sense amplifier 1 is slightly higher than 0 V, and the drain potential of $Q_2$ of the sense amplifier 10 is almost grounded. Therefore, the sense amplifier 1 outputs a low level through the sense amplifier output line 60 to the inverter 2a, and the sense amplifier 10 outputs a high level through the sense amplifier output line 6 to the inverter 2c.

Since the input of the inverter 2a is at a low level in the first case, the first input of the NAND circuit 2b is at a high level. At this time, the second input of the NAND circuit 2b is at a high level. Consequently, the output of the NAND circuit 2b is at a low level. Furthermore, since the input of the inverter 2f is at a high level, the first input of the NOR circuit 2e is at a low level. On the other hand, the input of the inverter 2c is at a high level, and therefore the second input of the NOR circuit 2e is at a high level. Consequently, the output of the NOR circuit 2e is at a low level. Accordingly, in the first case, $Q_6$ and $Q_7$ of the three-state output circuit 17 are turned ON, and $Q_8$ and $Q_9$ are turned OFF. Therefore, the output of the three-state output circuit 17 is at a high level.

The case where the actuating signal SE is at a high level and the potential of the bit line 5 is lower than that of the bit line 50 is designated as the second case.

In the second case, $Q_1$ and $Q_2$ of the sense amplifiers 1 and 10 operate in the reverse manner as those in the above-described first case. In the second case, therefore, the sense amplifier 10 outputs a low level to the inverter 2c, and the sense amplifier 1 outputs a high level to the inverter 2a.

Since the input of the inverter 2a is at a high level, the first input of the NAND circuit 2b is at a low level. Since the second input of the NAND circuit 2b is at a high level, the output of the NAND circuit 2b is at a high level. On the other hand, the first input of the NOR circuit 2e is at a low level, and the second input of the NOR circuit 2e is at a low level. Therefore, the output of the NOR circuit 2e is at a high level. Accordingly, in the second case, $Q_6$ and $Q_7$ of the three-state output circuit 17 are turned OFF, and $Q_8$ and $Q_9$ are turned ON. Therefore, the output of the three-state output circuit 17 is at a low level.

Figure 2:
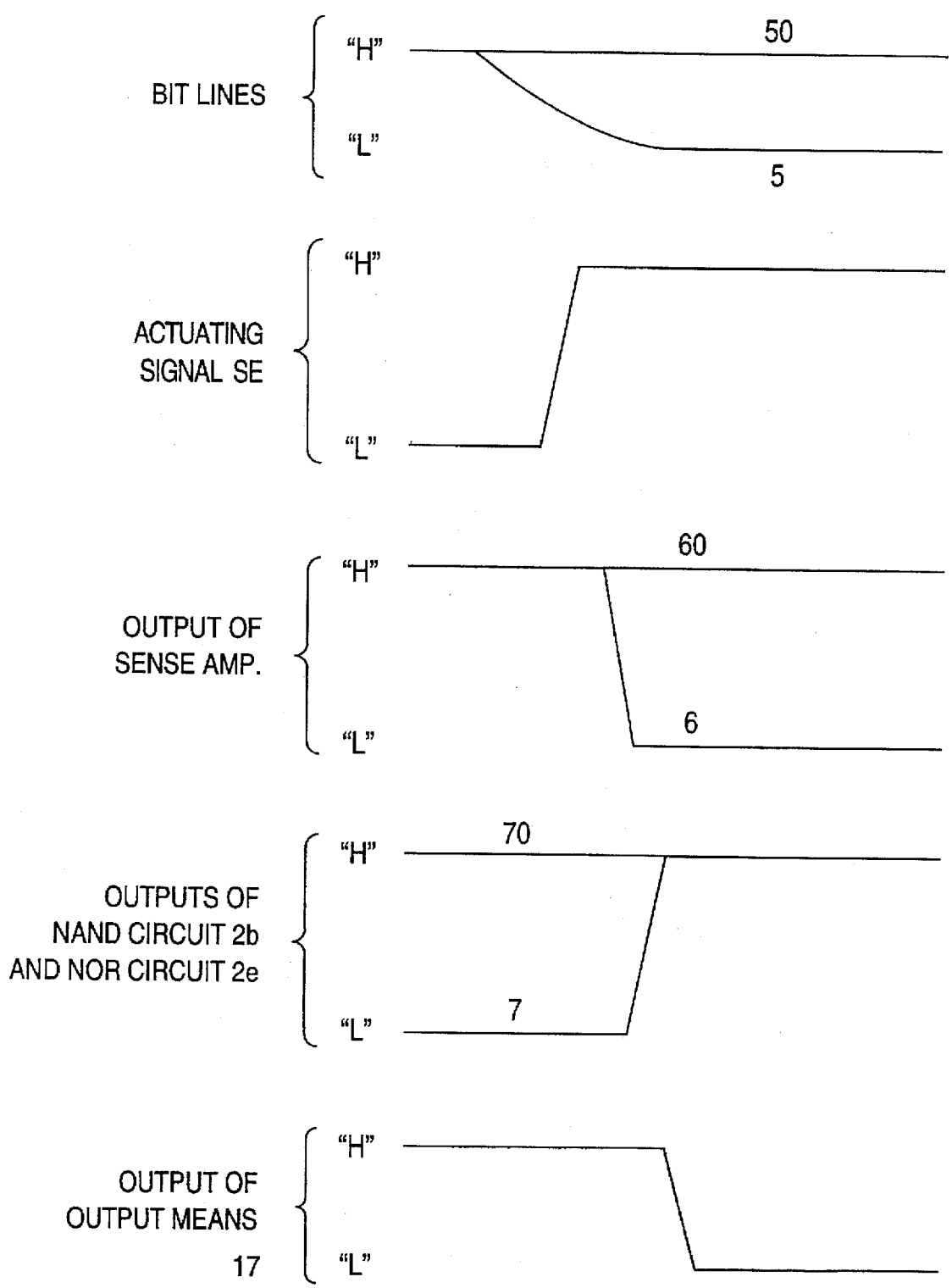
FIG. 2 is a timing chart of the signal amplifying device of FIG. 1.

FIG. 2 shows timing charts for the bit lines 5 and 50, the actuating signal SE, the sense amplifier output lines 6 and 60, the outputs of the NAND and NOR circuits 2b and 2e, and the output of the three-state output circuit 17 of the signal amplifying device of FIG. 1 which are obtained in the second case. When a signal of a low level is to be read out from the bit lines 5 and 50 which are at a high level, the potential of the bit line 5 is first changed from a high level to a low level as shown in FIG. 2, and the actuating signal SE is set to a high level as shown in FIG. 2. The signals on the bit lines 5 and 50 which constitute a data line pair are respectively amplified by the sense amplifiers 1 and 10, and a signal of a low level is output to the sense amplifier output line 6 as shown in FIG. 2. At this time, the output of the NOR circuit 2e is changed to a high level as shown in FIG. 2. This causes the output of the three-state output circuit 17 which is a sense amplifier buffer, to be changed from a high level to a low level as shown in FIG. 2.

As far as a normal signal flows on the bit lines 5 and 50, it is impossible to produce a situation wherein the actuating signal SE is at a high level and the potentials of both the bit lines 5 and 50 are at a low level. When a noise appears on the bit lines 5 and 50, however, it is possible that the potentials of both the bit lines 5 and 50 are at a low level. The case where the potentials of both the bit lines 5 and 50 are at a low level and both the sense amplifier output lines 6 and 60 are at a high level is designated as the third case. The case where a noise enters both the sense amplifier output lines 6 and 60 and the potentials of both the sense amplifier output lines 6 and 60 become high, is also designated as the third case.

In the third case, since a signal of a high level is input into the inverter 2a, the first input of the NAND circuit 2b is at a low level. On the other hand, the second input of the NAND circuit 2b is at a high level. Therefore, the output of the NAND circuit 2b is at a high level. Since a signal of a high level is input into the inverter 2f, the first input of the NOR circuit 2e is at a low level. On the other hand, since a signal of a high level is input into the inverter 2c, the second input of the NOR circuit 2e is at a high level. Consequently, the output of the NOR circuit 2e is at a low level. Accordingly, in the third case, $Q_6$ and $Q_9$ of the three-state output circuit 17 are turned OFF, and $Q_7$ and $Q_8$ are turned ON. Therefore, the output of the three-state output circuit 17 is set to a high-impedance state.

As far as a normal signal flows on the bit lines 5 and 50, it is impossible to produce a situation wherein the actuating signal SE is at a high level and the potentials of both the bit lines 5 and 50 are at a high level. When a noise appears on the bit lines 5 and 50, however, it is possible that the potentials of both the bit lines 5 and 50 are at a high level. The case where the potentials of both the bit lines 5 and 50 are at a high level and both the sense amplifier output lines 6 and 60 are at a low level, and the case where a noise appears on the sense amplifier output lines 6 and 60 to make the potentials of both the sense amplifier output lines 6 and 60 a low level are designated as the fourth case. Also in the case where, when the actuating signal SE is at a low level and the potentials of both the bit lines 5 and 50 are at a high level, a noise enters the actuating signal line 8 and a signal of a high level flows into the transistors $Q_5$ of the sense amplifiers 1 and 10, the fourth case is produced.

In the fourth case, since a signal of a low level is input into the inverter 2a, the first input of the NAND circuit 2b is at a high level. Further, the second input of the NAND circuit 2b is at a high level. Therefore, the output of the NAND circuit 2b is at a low level. On the other hand, since a signal of a high level is input into the inverter 2f, the first input of the NOR circuit 2e is at a low level. Further, a signal of a low level is input into the inverter 2c, and the second input of the NOR circuit 2e is at a low level. Consequently, the output of the NOR circuit 2e is at a high level. Accordingly, in the fourth case, $Q_6$ and $Q_9$ of the three-state output circuit 17 are turned ON, and $Q_7$ and $Q_8$ are turned OFF. Then, the output of the three-state output circuit 17 is set to a high-impedance state.

The case where the actuating signal SE is at a low level is designated as a fifth case. In the fifth case, both the sense amplifiers 1 and 10 are deactivated.

In the fifth case, even when one or both of the sense amplifier output lines 6 and 60 are caused to have a potential of a high level due to noise, the second input of the NAND circuit 2b and the input of the inverter 2f of the three-state output circuit remain at a low level. Therefore, the output of the NAND circuit 2b is always at a high level, and the output of the NOR circuit 2e is always at a low level. Accordingly, in the fifth case, $Q_6$ and $Q_9$ of the three-state output circuit 17 are turned OFF, and $Q_7$ and $Q_8$ are turned ON. Therefore, the output of the three-state output circuit 17 is set to a high-impedance state.

A truth table of the signal states of the sense amplifier output lines 6 and 60, the actuating signal line 8, and the output of the three-state output circuit 17 which are obtained in the first to fifth cases described above is shown in Table 1 below.

TABLE 1

| output line 6 | H | L | H | L | H | L | H | L |
|---|---|---|---|---|---|---|---|---|
| output line 60 | L | H | H | L | L | H | H | L |
| actuated signal SE | H | H | H | H | L | L | L | L |
| output of circuit 17 | H | L | HiZ | HiZ | HiZ | HiZ | HiZ | HiZ |

As is apparent from the above description and Table 1, in the cases where the actuating signal SE is at a high level and the potential of the bit line 5 is different from that of the bit line 50, different logical levels are output to the sense amplifier output lines 6 and 60, respectively. As a result, the three-state output circuit 17 outputs a signal of the same logical level as that of the signal which is on the sense amplifier output line 6. In the other cases, the output of the three-state output circuit 17 is set to a high-impedance state. In other words, when a noise causes the bit lines 5 and 50 to be at the same logical level or the sense amplifier output lines 6 and 60 to be at the same logical level during the operative period of the sense amplifiers 1 and 10, the output of the three-state output circuit 17 can surely be set to a high-impedance state. Also when a noise causes the actuating signal SE to be at a low level during the operative period of the sense amplifiers 1 and 10, the output of the three-state output circuit 17 can surely be set to a high-impedance state. Consequently, a large amount of current is prevented from flowing through the transistors of the three-state output circuit 17 from the power source to the ground.

During the read wait period when the operation of reading out data from the memory cell is not conducted, the bit lines 5 and 50 are maintained at a high level, and the sense amplifiers 1 and 10 are halted from operating. When the actuating signal SE is set to a high level due to noise during the inoperative period of the sense amplifiers 1 and 10, both the sense amplifier output lines 6 and 60 are set to a low level because the levels of the bit lines 5 and 50 are high, thereby setting the output of the three-state output circuit 17 to a high-impedance state. Consequently, a large amount of current is prevented from flowing through the three-state output circuit 17, so that the three-state output circuit 17 does not output incorrect data.

Figure 3:
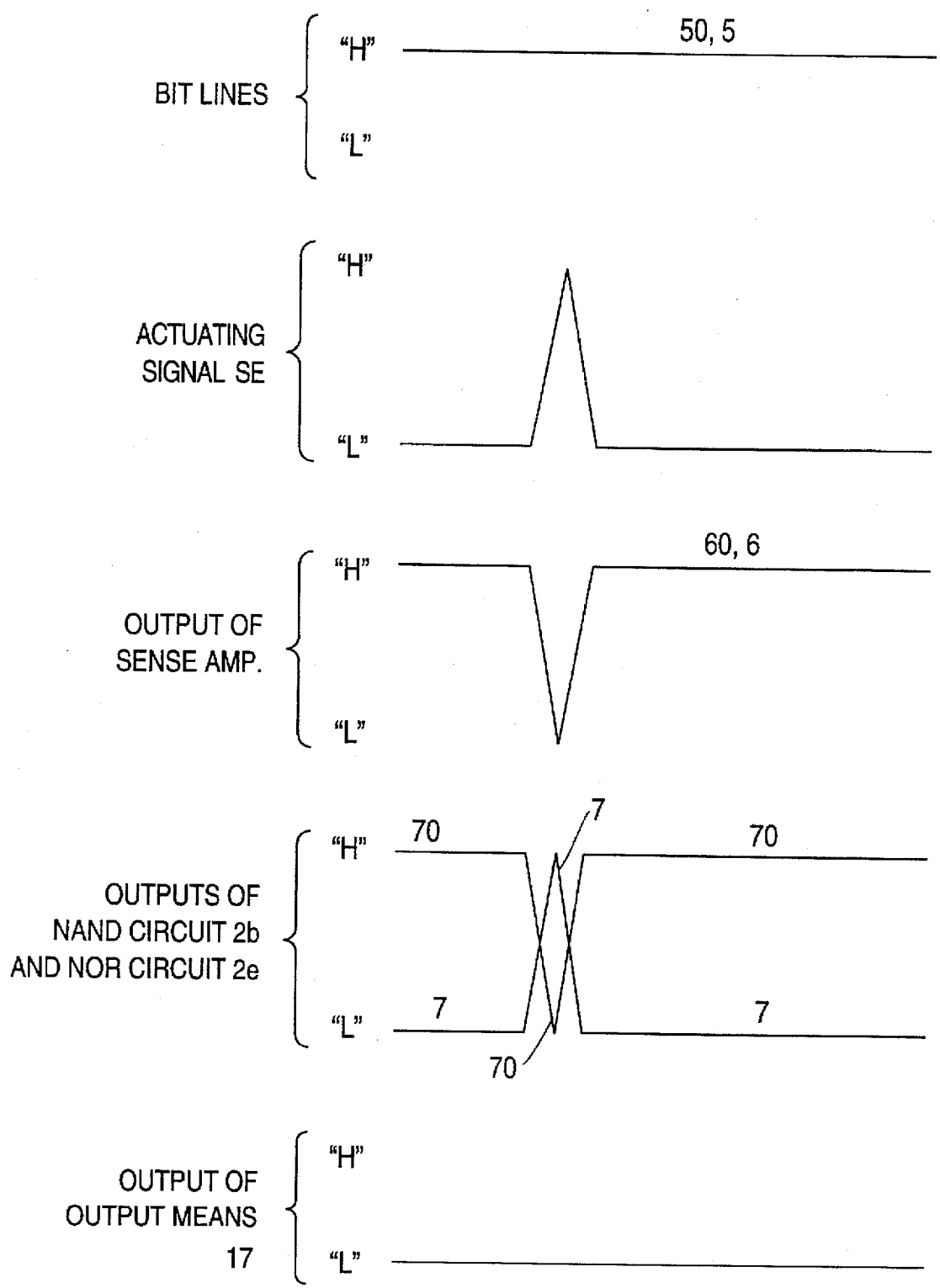
FIG. 3 is a timing chart of the device of FIG. 1 in the case where a pulse-like noise is generated in the actuating signal of the device of FIG. 1.

FIG. 3 shows a timing chart of the bit lines 5 and 50, the actuating signal, the sense amplifier output lines 6 and 60, the outputs of the NAND and NOR circuits 2b and 2e, and the output of the three-state output circuit 17 of the signal amplifying device of FIG. 1 which are obtained in the case where a pulse-like noise is generated in the actuating signal SE. In the case where a pulse-like noise is generated in the actuating signal SE as shown in FIG. 3 when both the signals on the bit lines 5 and 50 are at a high level which is the steady state of the signals as shown in FIG. 3, the sense amplifiers 1 and 10 respectively output signals having the same waveform as shown in FIG. 3. Therefore, the three-state output circuit 17 remains at a high-impedance state so that the output of the circuit 17 is maintained to a low level as shown in FIG. 3.

Figure 4:
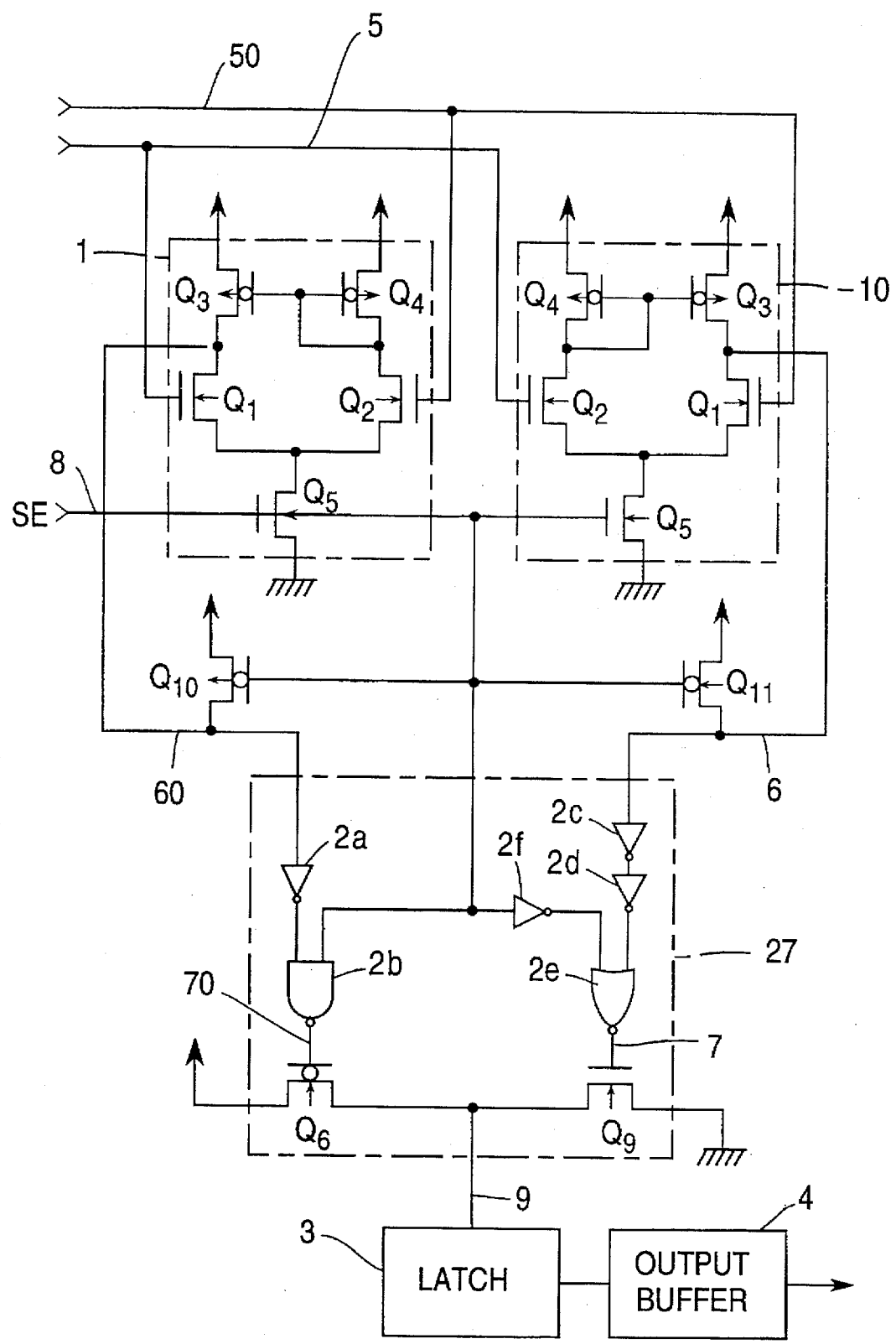
FIG. 4 is a schematic diagram showing the circuit of a second embodiment of the invention.

FIG. 4 is a schematic diagram showing a circuit of a second embodiment of the invention. In FIG. 4, components having the same function as those of the first embodiment of FIG. 1 are indicated by the same reference numbers.

The signal amplifying device of the second embodiment comprises two sense amplifiers 1 and 10, a three-state output circuit 27, a latch circuit 3, and an output buffer 4. The sense amplifiers 1 and 10 of the second embodiment have the same configuration as those of the first embodiment. The three-state output circuit 27 comprises a P-channel transistor $Q_6$, an N-channel transistor $Q_9$, four inverters 2a, 2c, 2d, and 2f, a NAND circuit 2b, and a NOR circuit 2e. The differences in configuration between the first and second embodiments will be described below.

The second embodiment further comprises two P-channel transistors $Q_{10}$ and $Q_{11}$ (hereinafter, the transistors used in the second embodiment are often designated only by the respective reference numbers). The source of $Q_{10}$ is connected to the sense amplifier output line 60, and the source of $Q_{11}$ is connected to the sense amplifier output line 6. The drains of and $Q_{11}$ are connected to a power source. The gates of $Q_{10}$ and $Q_{11}$ are connected to the gates of the transistors $Q_5$ of the sense amplifiers 1 and 10. The three-state output circuit 17 of the first embodiment comprises $Q_6$, $Q_7$, $Q_8$, and $Q_9$. In contrast, the three-state output circuit 27 of the second embodiment comprises two transistors $Q_6$ and $Q_9$. The drain of $Q_6$ is connected to the power source, and the source of $Q_6$ is connected to the drain of $Q_9$ and the latch circuit 3. The source of $Q_9$ is grounded. The gate of $Q_6$ is connected to the output of the NAND circuit 2b, and the gate of $Q_9$ is connected to the output of the NOR circuit 2e.

The operation of the second embodiment will be described below.

When the actuating signal SE is at a high level, the transistors $Q_5$ of both the sense amplifiers 1 and 10 are turned ON. The sense amplifiers 1 and 10 are activated when the actuating signal SE is at a high level, and deactivated when the actuating signal SE is at a low level. When data from the memory cell is output to the sense amplifiers 1 and 10 through the bit lines 5 and 50, the minute potential difference between the bit lines 5 and 50 is differentially amplified by the sense amplifiers 1 and 10. In accordance with the input data, the sense amplifiers 1 and 10 output logical levels which are complementary to each other, to the sense amplifier output lines 6 and 60. During the read wait period when the data read out operation is not conducted, both the bit lines 5 and 50 are maintained at a high level.

The transistors $Q_{11}$ and $Q_{10}$ connected to the sense amplifier output lines 6 and 60 function as pull-up transistors. The actuating signal SE is input into the gates of $Q_{10}$ and $Q_{11}$.

In the three-state output circuit 27, the threshold voltages of the inverters 2a and 2c connected to the sense amplifier output lines 60 and 6 are set to a lower level than that which is usually used. The signal output from the source of $Q_6$ and the drain of $Q_9$ is a signal which is output from the three-state output circuit 27 to the latch circuit 3. The output signal from the three-state output circuit 27 is output to the output buffer 4 through the latch circuit 3. A truth table of the input and output signals of the three-state output circuit 27 is shown in Table 2 below.

TABLE 2

| output line 6 | H | L | H | L | H | L | H | L |
|---|---|---|---|---|---|---|---|---|
| output line 60 | L | H | H | L | L | H | H | L |
| actuated signal SE | H | H | H | H | L | L | L | L |
| output of circuit 17 | H | L | HiZ | — | HiZ | HiZ | HiZ | HiZ |

The operation of the of the second embodiment will be described while comparing it with that of the first embodiment.

The case where the actuating signal SE is at a high level and the potential of the bit line 5 is higher than that of the bit line 50 is designated as a first case.

In the first case, both the pull-up transistors $Q_{10}$ and $Q_{11}$ are in the nonconductive state. Since the input of the inverter 2a is at a low level, the first input of the NAND circuit 2b is at a high level. On the other hand, the second input of the NAND circuit 2b is at a high level. Consequently, the output of the NAND circuit 2b is at a low level. Further, since the input of the inverter 2f is at a high level, the first input of the NOR circuit 2e is at a low level, and, since the input of the inverter 2c is at a high level, the second input of the NOR circuit 2e is at a high level. Consequently, the output of the NOR circuit 2e is at a low level.

Accordingly, in the first case, $Q_6$ of the three-state output circuit 27 is turned ON, and $Q_9$ is turned OFF. Therefore, the output of the three-state output circuit 27 is at a high level.

The case where the actuating signal SE is at a high level and the potential of the bit line 5 is lower than that of the bit line 50 is designated as a second case.

In the second case, the pull-up transistors $Q_{10}$ and $Q_{11}$ are in the nonconductive state. Since the input of the inverter 2a is at a high level, the first input of the NAND circuit 2b is at a low level, and the second input of the NAND circuit 2b is at a high level. Consequently, the output of the NAND circuit 2b is at a high level. Further, since the input of the inverter 2f is at a high level in the second case, the first input of the NOR circuit 2e is at a low level, and, since the input of the inverter 2c is at a low level, the second input of the NOR circuit 2e is at a low level. Consequently, the output of the NOR circuit 2e is at a high level. Accordingly, $Q_6$ of the three-state output circuit 27 is turned OFF, and $Q_9$ is turned ON. Therefore, the output of the three-state output circuit 27 is at a low level.

Usually, it is impossible to produce a situation wherein the actuating signal SE is at a high level and the potentials of both the bit lines 5 and 50 are at a low level. The case where the amplifiers 1 and 10 are activated and the potentials of both the sense amplifier output lines 6 and 60 are set to a high level by a noise is designated as a third case.

In the third case, the pull-up transistors $Q_{10}$ and $Q_{11}$ are in the nonconductive state. Since the input of the inverter 2a is at a high level, the first input of the NAND circuit 2b is at a low level, and the second input of the NAND circuit 2b is at a high level. Consequently, the output of the NAND circuit 2b is at a high level. Further, since the input of the inverter 2f is at a high level, the first input of the NOR circuit 2e is at a low level, and, since the input of the inverter 2c is at a high level, the second input of the NOR circuit 2e is at a high level. Consequently, the output of the NOR circuit 2e is at a low level. Accordingly, $Q_6$ and $Q_9$ of the three-state output circuit 27 are turned OFF, and the output of the three-state output circuit 27 is set to a high-impedance state.

Usually, it is impossible to produce a situation wherein the actuating signal SE is at a high level and the potentials of both the bit lines 5 and 50 are at a high level. A situation wherein the potentials of both the bit lines 5 and 50 are at a high level occurs during the read wait period. During the read wait period, the actuating signal SE is at a low level. The case where the amplifiers 1 and 10 are activated and both the sense amplifier output lines 6 and 60 are at a low level due to the noise is designated as a fourth case.

In the fourth case, the pull-up transistors $Q_{10}$ and $Q_{11}$ are in the nonconductive state. Since the input of the inverter 2a is at a low level, the first input of the NAND circuit 2b is at a high level, and the second input of the NAND circuit 2b is at a high level. Consequently, the output of the NAND circuit 2b is at a low level. Further, since the input of the inverter 2f is at a high level, the first input of the NOR circuit 2e is at a low level, and since the input of the inverter 2c is at a low level, the second input of the NOR circuit 2e is at a low level. Consequently, the output of the NOR circuit 2e is at a high level. Accordingly, $Q_6$ and $Q_9$ of the three-state output circuit 27 are turned ON, and therefore a current may pass through the three-state output circuit 27. In the signal amplifying device of the second embodiment, however, the threshold voltages of the inverters 2a and 2c are set to a lower level. Therefore, the outputs of the inverters 2a and 2c do not become high until the input levels of the inverters 2a and 2c are reduced to a considerably low value. Consequently, the fourth case occurs very seldom.

The case where the actuating signal SE is at a low level is designated as a fifth case. In the fifth case, under any combination of high and low levels of the potentials of the bit lines 5 and 50, the transistors $Q_5$ of the sense amplifiers 1 and 10 are turned OFF and the pull-up transistors $Q_{10}$ and $Q_{11}$ are in the conductive state.

In the fifth case, even when one or both of the sense amplifier output lines 6 and 60 are caused to have a potential of a high level due to noise, the first input of the NAND circuit 2b and the input of the inverter 2f of the three-state output circuit 27 are at a low level. Therefore, the output of the NAND circuit 2b is at a high level, and the output of the NOR circuit 2e is at a low level. Accordingly, $Q_6$ and $Q_9$ of the three-state output circuit 27 are turned OFF, and the output of the three-state output circuit 27 is set to a high-impedance state.

When a noise causes both the sense amplifier output lines 6 and 60 to be at a high level during the operative period of the sense amplifiers 1 and 10, the output of the three-state output circuit 27 can surely be set to a high-impedance state. When the three-state output circuit 27 is at a high-impedance state, a large amount of current is prevented from flowing through the transistors in the three-state output circuit 27 from the power source to the ground. Therefore, a situation in which a noise, which is temporarily generated, causes a current to pass through the three-state output circuit 27 occurs very seldom.

When a noise causes the actuating signal SE to be at a low level during the operative period of the sense amplifiers 1 and 10, the pull-up transistors $Q_{10}$ and $Q_{11}$ are turned ON. When $Q_{10}$ and $Q_{11}$ are turned ON, both the sense amplifier output lines 6 and 60 are at a high level, whereby the output of the three-state output circuit 27 is surely set to a high-impedance state. In the second embodiment, during a low-level period of the actuating signal SE, the output of the three-state output circuit 27 is maintained at a high-impedance state.

During the read wait period when the operation of reading out data from the memory cell is not conducted, the bit lines 5 and 50 are maintained at a high level, and the sense amplifiers 1 and 10 are halted from operating. When the actuating signal SE is set to a high level by a noise during the inoperative period of the sense amplifiers 1 and 10, the P-channel pull-up transistors $Q_{10}$ and $Q_{11}$ are turned OFF. In the second embodiment, the threshold voltages of the inverters 2a and 2c of the three-state output circuit 27 are set to a lower level than that which is usually used. Therefore, a situation wherein a noise, which is temporarily generated, causes the potentials of both the sense amplifier output lines 6 and 60 to cross the threshold voltages occurs very seldom. Accordingly, even when a noise is temporarily generated and the actuating signal SE reaches a high level during the read wait period, it is possible to maintain the output of the three-state output circuit 27 at a high-impedance state.

Figure 5:
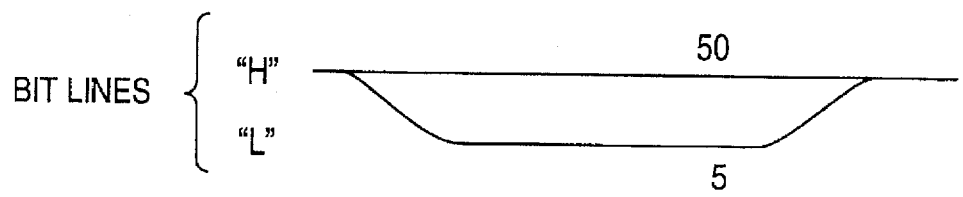
FIG. 5 is a timing chart of the device of FIG. 4. The timing chart in this case is from where a pulse-like noise is generated in an actuating signal SE when the actuating signal SE is at a low level.
Figure 5:
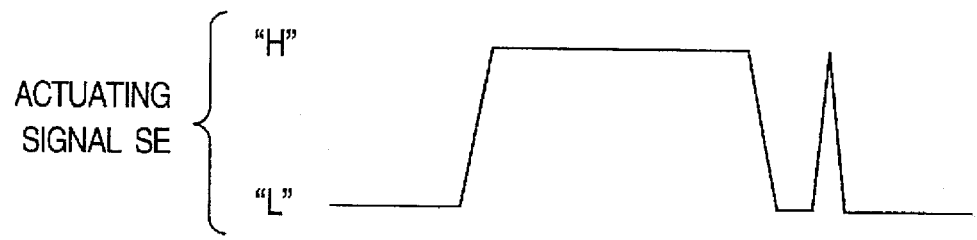
Figure 5:
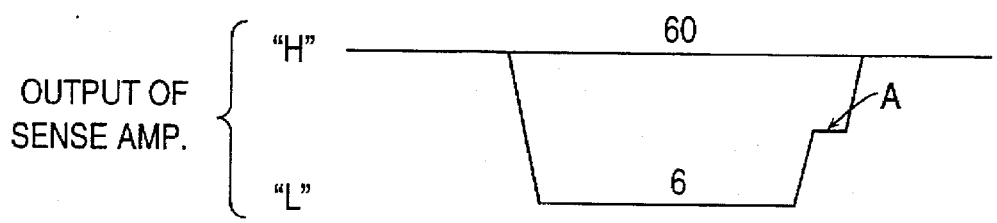
Figure 5:
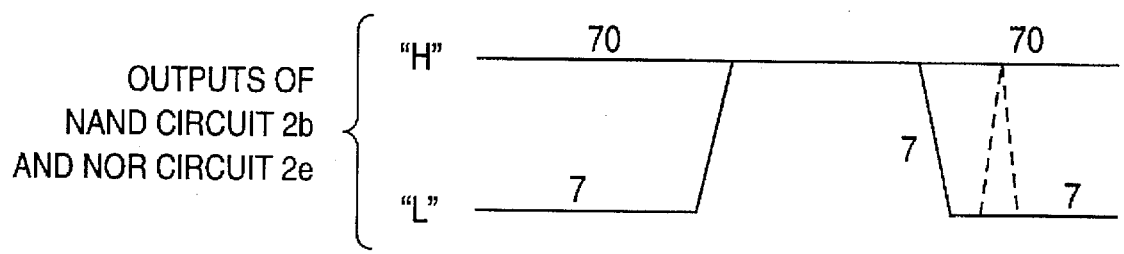
Figure 5:
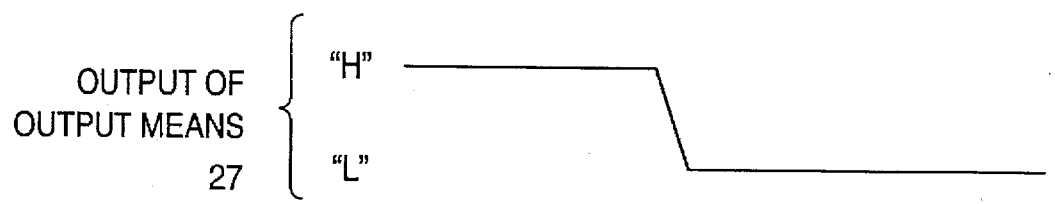

FIG. 5 shows a timing chart for the main portions of the signal amplifying device of FIG. 4 which are obtained in the second case, and also a timing chart in the case where a pulse-like noise is generated in the actuating signal SE after the actuating signal SE is set to a low level. In a usual read out operation in which the potential is changed from a high level to a low level, a memory cell is first selected and the potential of the bit line 5 is changed from a high level to a low level as shown in FIG. 5. Then, the actuating signal SE is changed to a high level as shown in FIG. 5. Then, the signals on the bit lines 5 and 50 which constitute a data line pair are amplified by the sense amplifiers 1 and 10, and a signal of a low level is output to the sense amplifier output line 6 as shown in FIG. 5. At this time, the output of the NOR circuit 2e is changed to a high level as shown in FIG. 5. This causes the output of the three-state output circuit 27 which is a sense amplifier buffer, to be changed from a high-impedance state to a low level signal, and a node 9 is changed from a high level to a low level as shown in FIG. 5.

When the actuating signal SE is then changed to a low level as shown in FIG. 5 so that the bit lines 1 and 10 enter the nonselected state, the sense amplifier output line 6 is made to transfer to a high level by the transistor $Q_{11}$. When a pulse-like noise is generated in the actuating signal SE under this state as shown in FIG. 5, the output of the three-state output circuit 27 which is a sense amplifier buffer has either of the following states: In the case where a signal potential A of the sense amplifier output line 6 shown in FIG. 5 is not higher than the turnover potential of the inverter 2c, the NOR circuit 2e outputs once a signal of a high level as shown by a broken line of FIG. 5, and the three-state output circuit 27 outputs again a signal of a low level. In the case where the signal potential A of the sense amplifier output line 6 shown in FIG. 5 transfers to a level higher than the turnover potential of the inverter 2c, the output of the NOR circuit 2e remains at a low level. Therefore, the output of the three-state output circuit 27 is maintained at a high-impedance state, and the node 9 and the output buffer 4 are maintained at a low level.

Figure 6:
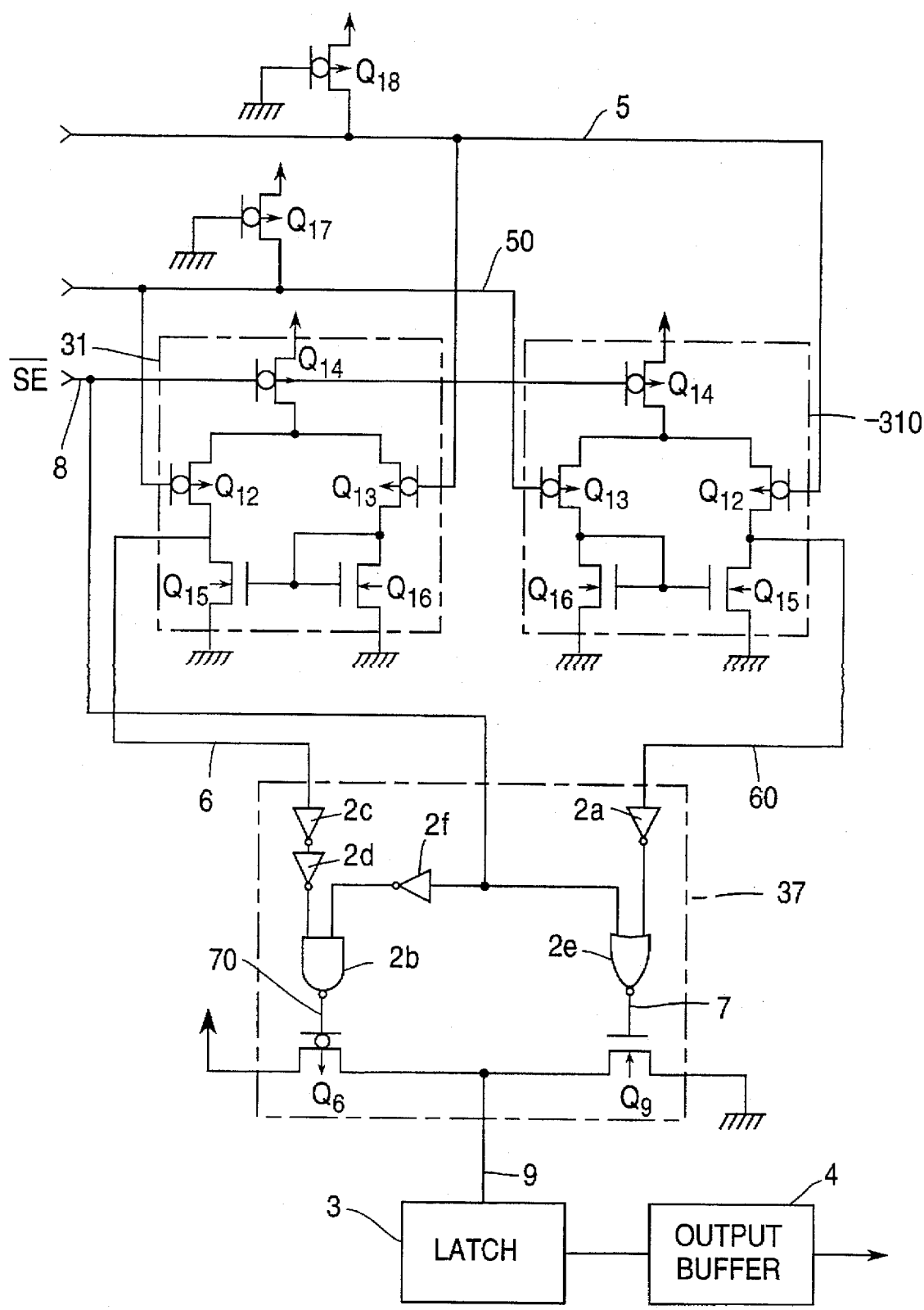
FIG. 6 is a schematic diagram showing a circuit of a third embodiment of the invention.

FIG. 6 is a schematic diagram showing a circuit of a signal amplifying device of a third embodiment of the invention. Components having the same function as those of the signal amplifying device of the first embodiment of FIG. 1 and the second embodiment of FIG. 4 are indicated by the same reference numbers.

The signal amplifying device of the third embodiment comprises two sense amplifiers 31 and 310, a three-state output circuit 37, a latch circuit 3, and an output buffer 4. Each of the sense amplifiers 31 and 310 comprises three P-channel transistors $Q_{12}$, $Q_{13}$, and $Q_{14}$, and two N-channel transistors $Q_{15}$ and $Q_{16}$. The three-state output circuit 37 comprises a P-channel transistor $Q_6$, an N-channel transistor $Q_9$, four inverters 2a, 2c, 2d, and 2f, a NAND circuit 2b, and a NOR circuit 2e.

In each of the sense amplifiers 31 and 310, the two N-channel transistors $Q_{15}$ and $Q_{16}$ constitute a current mirror circuit (hereinafter, the transistors used in the third embodiment are often indicated only by the respective reference numbers used in the figure). The gate of $Q_{15}$ is connected to the gate and drain of $Q_{16}$. The sources of the two transistors $Q_{15}$ and $Q_{16}$ are grounded, and the drains of the transistors $Q_{15}$ and $Q_{16}$ are connected to the sources of the two transistors $Q_{12}$ and $Q_{13}$, respectively. The drains of both transistors $Q_{12}$ and $Q_{13}$ are connected to the source of $Q_{14}$. The drain of $Q_{14}$ is connected to a power source.

The sense amplifiers 31 and 310 are connected through a pair of signal lines 5 and 50 to a memory cell which is not shown. The signal lines 5 and 50 are a pair of complementary bit lines through which data read out from the memory cell is input into the sense amplifiers 31 and 310. The bit lines 50 and 5 are connected to the sources of the P-channel transistors $Q_{17}$ and $Q_{18}$, respectively. The drains of $Q_{17}$ and $Q_{18}$ are connected to the power source, and the gates of $Q_{17}$ and $Q_{18}$ are grounded. The two transistors $Q_{17}$ and $Q_{18}$ are pull-up transistors. Since the gates of $Q_{17}$ and $Q_{18}$ are grounded, $Q_{17}$ and $Q_{18}$ are always turned ON to function as resistors. During the read wait period when the data read out operation is not conducted, the bit lines 5 and 50 are maintained at a high level. The bit line 5 is connected to the gate of $Q_{13}$ of the sense amplifier 31 and that of $Q_{12}$ of the sense amplifier 310, and the bit line 50 is connected to the gate of $Q_{12}$ of the sense amplifier 31 and that of $Q_{13}$ of the sense amplifier 310. The sense amplifier output line 60 is connected to the drain of $Q_{15}$ of the sense amplifier 310, and the sense amplifier output line 6 is connected to the drain of $Q_{15}$ of the sense amplifier 31. The gates of the transistors $Q_{14}$ of the sense amplifiers 31 and 310 are connected to an actuating signal line 8.

In the three-state output circuit 37 of the third embodiment, $Q_6$, $Q_7$, $Q_8$, and $Q_9$ of the three-state output circuit 17 of the first embodiment are replaced with $Q_6$ and $Q_9$. The drain of $Q_6$ is connected to the power source, and the source of $Q_6$ is connected to the drain of $Q_9$. The source of $Q_9$ is grounded.

The drain of $Q_{15}$ of the sense amplifier 31 is connected to the input of the inverter 2c through the sense amplifier output line 6. The output of the inverter 2c is connected to the input of the inverter 2d. The output of the inverter 2d is connected to the input of the first input of the NAND circuit 2b. The gates of the transistors $Q_{14}$ of the sense amplifiers 31 and 310 are connected through the actuating signal line 8 to the input of the inverter 2f and the first input of the NOR circuit 2e. The output of the inverter 2f is connected to the second input of the NAND circuit 2b. The output of the NAND circuit 2b is connected to the gate of $Q_6$. The drain of $Q_{15}$ of the sense amplifier 310 is connected to the input of the inverter 2a through the sense amplifier output line 60. The output of the inverter 2a is connected to the second input of the NOR circuit 2e. The output of the NOR circuit 2e is connected to the gate of $Q_9$. The drain of $Q_9$ is connected to the input of a latch circuit 3. The output of latch circuit 3 is connected to an output buffer 4 which has an output terminal.

When the actuating signal $\overline{SE}$ (since the inverted actuating signal SE used in the third embodiment of the invention shown in FIG. 6 is active at a low level, it is indicated by $\overline{SE}$) to the sense amplifiers 31 and 310 is at a low level, the transistors $Q_{14}$ of both the sense amplifiers 31 and 310 are turned ON. The sense amplifiers 31 and 310 are activated when the actuating signal $\overline{SE}$ is at a low level, and deactivated when the actuating signal $\overline{SE}$ is at a high level. When data of the memory cell is output to the sense amplifiers 31 and 310 through the bit lines 5 and 50, the minute potential difference between the bit lines 5 and 50 is differentially amplified by the sense amplifiers. In accordance with the input data, the sense amplifiers 31 and 310 output logical levels which are complementary to each other, to the sense amplifier output lines 6 and 60. During the read wait period when the data read out operation is not conducted, both the bit lines 5 and 50 are maintained at a high level.

A signal having a logical level which is obtained by inverting that of the actuating signal $\overline{SE}$ is supplied to the input of the NAND circuit 2b of the three-state output circuit 37. The actuating signal $\overline{SE}$ of the sense amplifiers 31 and 310 is supplied to the input of the NOR circuit 2e. The threshold voltages of the inverters 2c and 2a connected to the sense amplifier output lines 6 and 60 are set to a higher level than that which is usually used. The signal output from the source of $Q_6$ and the drain of $Q_9$ is a signal which is output from the three-state output circuit 37 to the latch circuit 3. The output signal from the three-state output circuit 37 is output to the output buffer 4 through the latch circuit 3. A truth table of the input and output signals of the three-state output circuit 37 is shown in Table 3 below.

TABLE 3

| output line 6 | H | L | H | L | H | L | H | L |
|---|---|---|---|---|---|---|---|---|
| output line 60 | L | H | H | L | L | H | H | L |
| actuated signal SE | L | L | L | L | H | H | H | H |
| output of circuit 17 | H | L | — | HiZ | HiZ | HiZ | HiZ | HiZ |

The case where the actuating signal $\overline{SE}$ is at a low level and the potential of the bit line 5 is higher than that of the bit line 50 is designated as a first case.

In the first case, the gate potentials of $Q_{13}$ of the sense amplifier 31 and $Q_{12}$ of the sense amplifier 310 are higher than those of $Q_{12}$ of the sense amplifier 31 and $Q_{13}$ of the sense amplifier 310. Since the conductivities of $Q_{12}$ of the sense amplifier 31 and $Q_{13}$ of the sense amplifier 310 are higher than those of $Q_{13}$ of the sense amplifier 31 and $Q_{12}$ of the sense amplifier 310, the source potential of $Q_{12}$ of the sense amplifier 31 becomes higher than that of $Q_{13}$ of the sense amplifier 31, and the source potential of $Q_{12}$ of the sense amplifier 310 becomes lower than that of $Q_{13}$ of the sense amplifier 310. In each of the sense amplifiers 31 and 310, $Q_{15}$ and $Q_{16}$ change in conductivity depending on the drain potential of $Q_{16}$. The current mirror circuit operates in the same manner in the following cases. In the first case, the source potentials of $Q_{12}$ of the sense amplifier 31 and $Q_{13}$ of the sense amplifier 310 are slightly lower than the power source voltage. Therefore, the sense amplifier outputs a high level through the sense amplifier output line 6 to the inverter 2c, and the sense amplifier outputs a low level through the sense amplifier output line 60 to the inverter 2a.

In the first case, since the input of the inverter 2c is at a high level, the first input of the NAND circuit 2b is at a high level, and, since the input of the inverter 2f is at a low level, the second input of the NAND circuit 2b is at a high level. Consequently, the output of the NAND circuit 2b is at a low level. On the other hand, the first input of the NOR circuit 2e is at a low level. Since the input of the inverter 2a is at a low level, the second input of the NOR circuit 2e is at a high level. Consequently, the output of the NOR circuit 2e is at a low level. Accordingly, $Q_6$ of the three-state output circuit 37 is turned ON, and $Q_9$ is turned OFF. Therefore, the output of the three-state output circuit 37 is at a high level.

The case where the actuating signal $\overline{SE}$ is at a low level and the potential of the bit line 5 is lower than that of the bit line 50 is designated as a second case.

In the second case, $Q_{12}$ and $Q_{13}$ of the sense amplifiers 31 and 310 operate in the reverse manner from those in the above-described first case. Therefore, the sense amplifier 31 outputs a low level to the inverter 2c through the sense amplifier output line 6, and the sense amplifier 310 outputs a high level to the inverter 2a through the sense amplifier output line 60.

In the second case, since the input of the inverter 2c is at a low level, the first input of the NAND circuit 2b is at a low level, and, since the input of the inverter 2f is at a low level, the second input of the NAND circuit 2b is at a high level. Consequently, the output of the NAND circuit 2b is at a high level. On the other hand, the first input of the NOR circuit 2e is at a low level, and since the input of the inverter 2a is at a high level, the second input of the NOR circuit 2e is at a low level, with the result that the output of the NOR circuit 2e is at a high level. Accordingly, $Q_6$ of the three-state output circuit 37 is turned OFF, and $Q_9$ is turned ON. Therefore, the output of the three-state output circuit 37 is at a low level.

Usually, it is impossible to produce a situation wherein the actuating signal $\overline{SE}$ is at a low level and the potentials of both the bit lines 5 and 50 are at a low level. The case where the actuating signal $\overline{SE}$ is at a low level and the levels of both the sense amplifier output lines 6 and 60 become high due to a noise is designated as a third case.

In the third case, since the input of the inverter 2c is at a high level, the first input of the NAND circuit 2b is at a high level, and, since the input of the inverter 2f is at a low level, the second input of the NAND circuit 2b is at a high level. Therefore, the output of the NAND circuit 2b is at a low level. On the other hand, the first input of the NOR circuit 2e is at a low level, and since a signal of a high level is input into the inverter 2a, the second input of the NOR circuit 2e is at a low level. Consequently, the output of the NOR circuit 2e is at a high level. Accordingly, $Q_6$ and $Q_9$ of the three-state output circuit 37 are turned ON, and therefore a current may pass through the three-state output circuit 37. However, in the third embodiment, the threshold voltages of the inverters 2a and 2c are set to a higher level. Even when both lines 6 and 60 become high due to noise which is temporarily generated, a situation wherein the potentials of both the sense amplifier output lines 6 and 60 cross the threshold voltages of the inverters 2a and 2c occurs very seldom. Therefore, it hardly occurs that the logical levels of both the sense amplifier output lines 6 and 60 are at a high level, whereby the possibility that a current passes through the three-state output circuit 37 is reduced to very low.

Usually, it is impossible to produce a situation wherein the actuating signal $\overline{SE}$ is at a low level and the potentials of both the bit lines 5 and 50 are at a high level. The case where the actuating signal $\overline{SE}$ is at a low level, and the levels of both the sense amplifier output lines 6 and 60 become low due to noise is designated as a fourth case.

In the fourth case, since a signal of a low level is input into the inverter 2c, the first input of the NAND circuit 2b is at a low level, and, since the input of the inverter 2f is at a low level, the second input of the NAND circuit 2b is at a high level. Therefore, the output of the NAND circuit 2b is at a high level. On the other hand, the first input of the NOR circuit 2e is at a low level, and since a signal of a low level is input into the inverter 2a, the second input of the NOR circuit 2e is at a high level. Consequently, the output of the NOR circuit 2e is at a low level.

Accordingly, in the fourth case, $Q_6$ and $Q_9$ of the three-state output circuit 37 are turned OFF, and the output of the three-state output circuit 37 is set to a high-impedance state. When the output of the three-state output circuit 37 is in a high-impedance state, a current is prevented from passing through the three-state output circuit 37, so that the three-state output circuit 37 does not output incorrect data.

The case where the actuating signal $\overline{SE}$ is at a high level is designated as a fifth case. In the fifth case, both the sense amplifiers 31 and 310 are deactivated.

In the fifth case, even when one or both of the sense amplifier output lines 6 and 60 are caused to have a potential of a high level due to noise, the input to the inverter 2f and the first input to the NOR circuit 2e of the three-state output circuit 37 remain at a high level. In the fifth case, therefore, the output of the NAND circuit 2b is at a high level, and the output of the NOR circuit 2e is at a low level. Accordingly, $Q_6$ and $Q_9$ of the three-state output circuit 37 are turned OFF, and therefore the output of the three-state output circuit 37 is set to a high-impedance state.

In the cases where the actuating signal $\overline{SE}$ is at a low level and the potential of the bit line 5 is different from that of the bit line 50, signals having logical levels which are complementary to each other are output to the sense amplifier output lines 6 and 60, and the three-state output circuit 37 outputs a signal of a logical level which corresponds to the logical levels of the sense amplifier output lines 6 and 60. In other cases, the output of the three-state output circuit 37 is set to a high-impedance state.

When noise causes both the sense amplifier output lines 6 and 60 to be at a low level during the operative period of the sense amplifiers 31 and 310, the output of the three-state output circuit 37 is set to a high-impedance state. When a noise causes the actuating signal $\overline{SE}$ to be at a high level during the operative period of the sense amplifier 31 and 310, the output of the three-state output circuit 37 can surely be set to a high-impedance state as described in the description of the fifth case.

During the read wait period when the operation of reading out data from the memory cell is not conducted, the bit lines 5 and 50 are maintained at a high level, and the sense amplifiers 31 and 310 are halted from operating. When the actuating signal $\overline{SE}$ is set to a high level by a noise during the inoperative period of the sense amplifiers 31 and 310, the transistors $Q_{12}$ and $Q_{13}$ of the sense amplifiers 31 and 310 are turned OFF because the levels of the bit lines 5 and 50 are high.

In the third embodiment, the threshold voltages of the inverters 2a and 2c are set to a higher level. Even when both $Q_{12}$ and $Q_{13}$ are caused to be turned OFF by noise which is temporarily generated, a situation wherein the potentials of both the sense amplifier output lines 6 and 60 cross the threshold voltages of the inverters 2a and 2c occurs very seldom. During the read wait period, therefore, it hardly occurs that the logical levels of both the sense amplifier output lines 6 and 60 are at a high level, whereby the possibility that current passes through the three-state output circuit 37 is reduced to a very low level.

When the actuating signal $\overline{SE}$ is set to a low level by noise during the inoperative period of the sense amplifiers 31 and 310, the transistors $Q_{12}$ and $Q_{13}$ of both the sense amplifiers 31 and 310 are turned OFF because the levels of the bit lines 5 and 50 are high. Since the bit lines 5 and 50 are maintained at a high level during the read wait period by the pull-up transistors $Q_{17}$ and $Q_{18}$, furthermore, $Q_{12}$ and $Q_{13}$ of the sense amplifiers 31 and 310 can surely be turned OFF. When both $Q_{12}$ and $Q_{13}$ are turned OFF, however, it is seldom that both the sense amplifier output lines 6 and 60 are at a high level.

Figure 7:
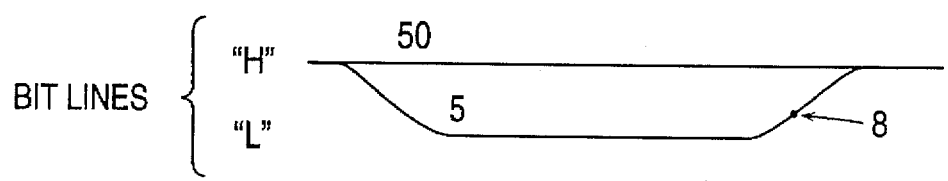
FIG. 7 is a timing chart of the device of FIG. 6. The timing chart in this case is from where a pulse-like noise is generated in an actuating signal $\overline{SE}$ when the actuating signal $\overline{SE}$ is at a high level.
Figure 7:
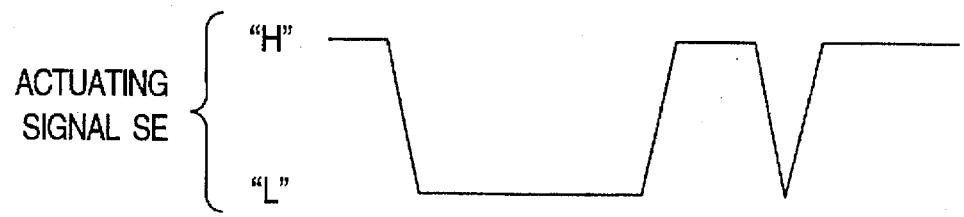
Figure 7:
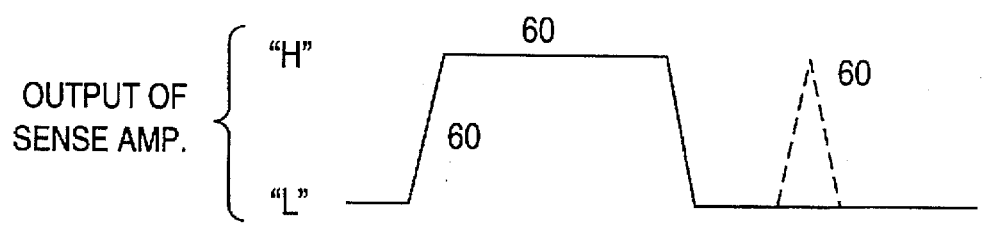
Figure 7:
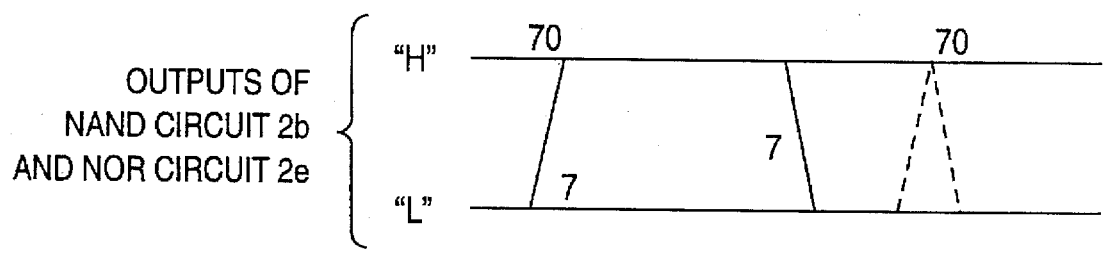
Figure 7:
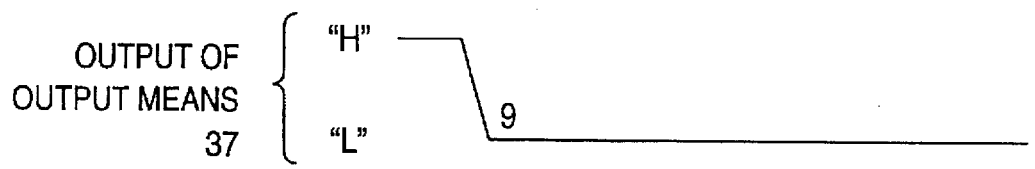

FIG. 7 shows timing charts for the main portions of the signal amplifying device of FIG. 6 which are obtained in the second case, and also timing charts in the case where a pulse-like noise is generated in the actuating signal $\overline{SE}$ after the actuating signal $\overline{SE}$ is set to a high level. In a usual read out operation in which the potential is changed from a high level to a low level, a memory cell is first selected so that the potential of the bit line 5 is changed from a high level to a low level as shown in FIG. 7, and the actuating signal $\overline{SE}$ is changed to a low level as shown in FIG. 7. Then, the signals on the bit lines 5 and 50 which constitute a data line pair are amplified by the sense amplifiers 31 and 310, and a signal of a high level is output to the sense amplifier output line 60 as shown in FIG. 7. At this time, the output of the NOR circuit 2e is changed from a low level to a high level as shown in FIG. 7. This causes the output of the three-state output circuit 37 which is a sense amplifier buffer, to be changed from a high-impedance state to a low level signal, and a node 9 is changed from a high level to a low level as shown in FIG. 7.

When the actuating signal $\overline{SE}$ is changed to a high level as shown in FIG. 7 so that the bit lines 31 and 310 enter the nonselected state, the bit lines 5 and 50 which constitute a data line pair transfer to the steady state. When a pulse-like noise is generated in the actuating signal $\overline{SE}$ under this state as shown in FIG. 7, the output of the three-state output circuit 37 which is a sense amplifier buffer has either of the following states: In the case where a potential B of the bit line 5 at this time is not higher than a potential at which the sense amplifier 310 outputs a signal of a high level (i.e., the potential at which the transistor $Q_{12}$ can sufficiently be turned ON), a signal of a high level is output to the sense amplifier output line 60 as shown by broken line of FIG. 7, and, in the case where the potential B is not higher than the turnover potential of the inverter 2c, the NOR circuit 2e outputs a signal of a high level as shown by a broken line of FIG. 7, and the three-state output circuit 37 outputs a signal of a low level as shown in FIG. 7. In the case where the potential B of the bit line 5 transfers to a level not lower than a potential at which the sense amplifier 310 outputs a signal of a low level (i.e., the potential at which the transistor $Q_{12}$ is turned OFF), the potential of the sense amplifier output line 60 shown in FIG. 7 is maintained at a low level, and the output of the NOR circuit 2e remains at a low level as shown in FIG. 7. Therefore, the output of the three-state output circuit 37 which is a sense amplifier buffer is maintained at a high-impedance state, and the node 9 and the output buffer 4 are maintained at a low level as shown in FIG. 7.

Figure 8:
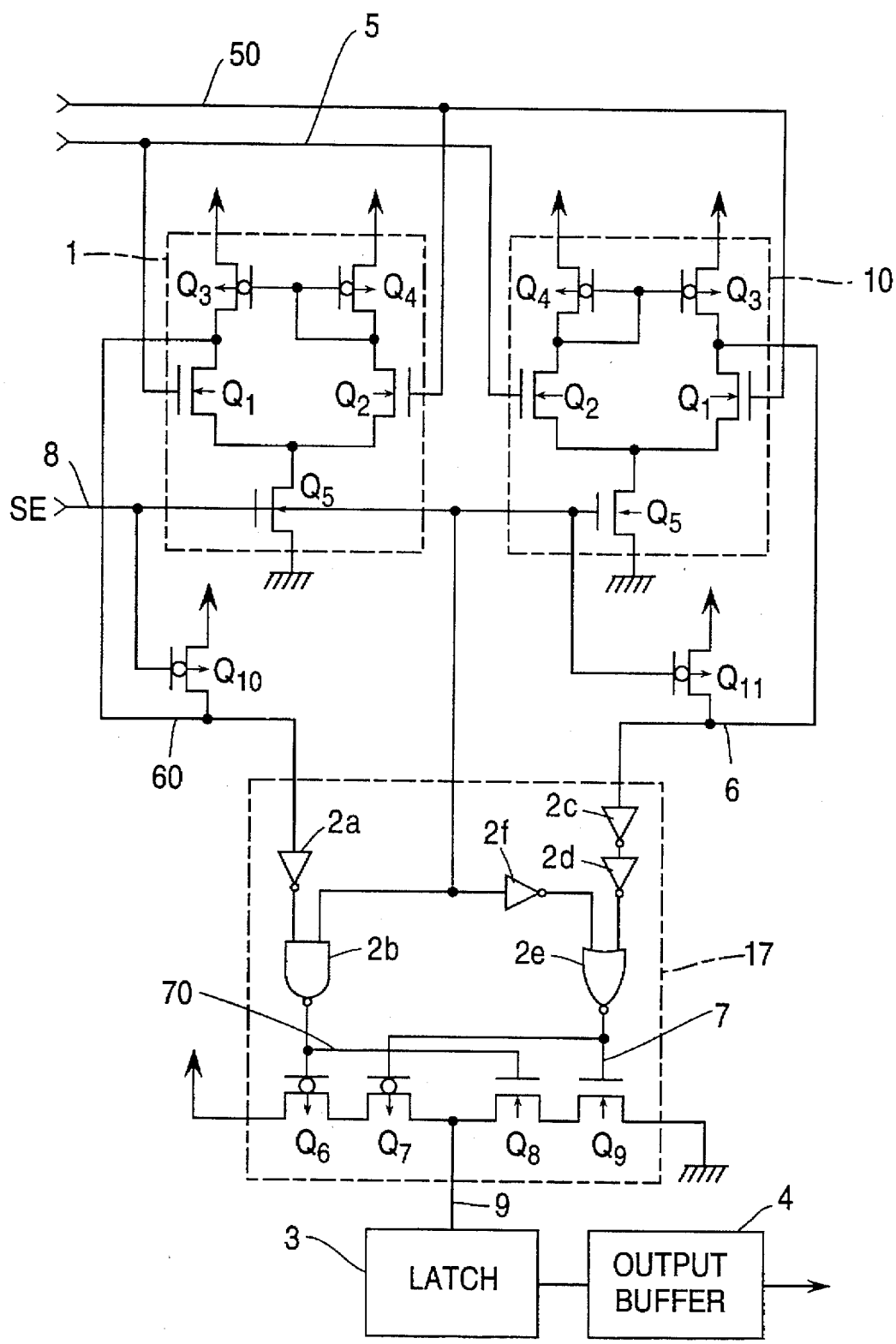
FIG. 8 is a schematic diagram showing a circuit of a fourth embodiment of the invention.

FIG. 8 is a schematic diagram showing a circuit for a signal amplifying device of a fourth embodiment of the invention. In FIG. 8, components having the same function as those of the signal amplifying device of the first embodiment of FIG. 1 are indicated by the same reference numbers. The signal amplifying device of the fourth embodiment comprises two sense amplifiers I and 10, a three-state output circuit 17, a latch circuit 3, and an output buffer 4. These components are identical with those of the first embodiment.

The differences in configuration between the signal amplifying device of the fourth embodiment and that of the first embodiment will be described below. The signal amplifying device of the fourth embodiment further comprises two P-channel transistors $Q_{10}$ and $Q_{11}$ (hereinafter, the transistors used in the fourth embodiment are often indicated only by the respective reference numbers used in FIG. 8). The source of $Q_{10}$ is connected to the sense amplifier output line 60, and the source of $Q_{11}$ is connected to the sense amplifier output line 6. The drains of $Q_{10}$ and $Q_{11}$ are connected to a power source. The gates of $Q_{10}$ and $Q_{11}$ are connected to the gates of the transistors $Q_5$ of the sense amplifiers 1 and 10, respectively. The transistors $Q_{11}$ and $Q_{10}$ connected to the sense amplifier output lines 6 and 60 function as pull-up transistors. The actuating signal SE is input into the gates of $Q_{10}$ and $Q_{11}$.

Figure 9:
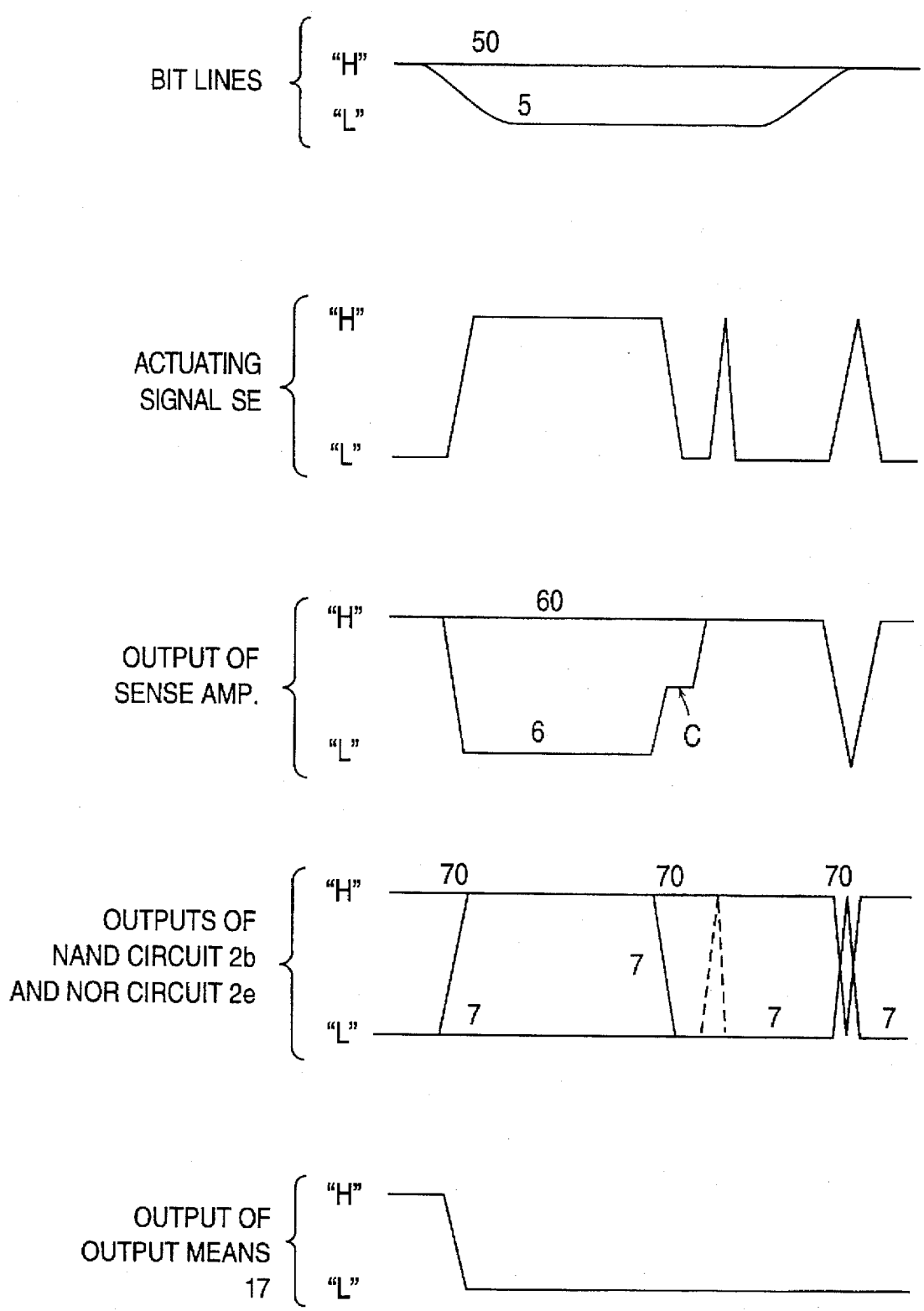
FIG. 9 is a timing chart of the device of FIG. 8. The timing chart in this case is from where a pulse-like noise is generated in an actuating signal SE when the actuating signal SE is at a low level.

FIG. 9 shows timing charts of the main portions of the signal amplifying device of FIG. 8, and also timing charts in the case where a pulse-like noise is generated in the actuating signal SE after the actuating signal SE is then set to a low level. In a usual read out operation in which the potential is changed from a high level to a low level, a memory cell is first selected so that the potential of the bit line 5 is changed from a high level to a low level as shown in FIG. 9, and the actuating signal SE is changed to a high level as shown in FIG. 9. Then, the signals on the bit lines 5 and 50 which constitute a data line pair are amplified by the sense amplifiers 1 and 10, and a signal of a low level is output to the sense amplifier output line 6 as shown in FIG. 9. At this time, the output of the NOR circuit 2e is changed to a high level as shown in FIG. 9. This causes the output of the three-state output circuit 17 which is a sense amplifier buffer, to be changed from a high-impedance state to a low level signal, and a node 9 is changed from a high level to a low level as shown in FIG. 9. When the actuating signal SE is then changed to a low level as shown in FIG. 9 and the bit lines 1 and 10 enter the nonselected state, the sense amplifier output line 6 is made to transfer to a high level by the transistor $Q_{11}$. When a pulse-like noise shown in FIG. 9 is generated in the actuating signal SE under this state, the output of the three-state output circuit 17 which is a sense amplifier buffer has either of the following states: In the case where a signal potential C of the sense amplifier output line 6 shown in FIG. 9 is not higher than the turnover potential of the inverter 2c, the NOR circuit 2e outputs a signal of a high level as shown by a broken line of FIG. 9, and the three-state output circuit 17 outputs a signal of a low level as shown in FIG. 9. In the case where the signal potential C of the sense amplifier output line 6 transfers to a level not lower than the turnover potential of the inverter 2c as shown in FIG. 9, the output of the NOR circuit 2e remains at a low level as shown in FIG. 9, and therefore the output of the three-state output circuit 17 is maintained at a high-impedance state, and the node 9 and the output buffer 4 are maintained at a low level as shown in FIG. 9.

In the case where a pulse-like noise is generated in the actuating signal SE as shown in FIG. 9 when the signals on both the bit lines 5 and 50 constituting a data line pair are at a high level which is the steady state of the signals as shown in FIG. 9, the sense amplifiers 1 and 10 respectively output the same data because the bit lines 5 and 50 are at the same level, the output of the three-state output circuit 17 which is a sense amplifier buffer remains at a high-impedance state, and the node 9 and the output buffer 4 are maintained at a low level.

In this way, when the actuating signal SE is at a low level, the transistors $Q_5$ of the sense amplifiers 1 and 10 are turned OFF and the pull-up transistors $Q_{10}$ and $Q_{11}$ are in the conductive state under any combination of high and low levels of the potentials of the bit lines 5 and 50.

In this situation, even when one or both of the sense amplifier output lines 6 and 60 are caused to have a potential of a high level due to noise, the first input of the NAND circuit 2b and the input of the inverter 2f of the three-state output circuit 17 remain at a low level. Under this state, the output of the NAND circuit 2b is at a high level, and the output of the NOR circuit 2e is at a low level. Therefore, both $Q_6$ and $Q_9$ of the three-state output circuit 17 are turned OFF, and the output of the three-state output circuit 17 is at a high-impedance state.

When noise causes both the sense amplifier output lines 6 and 60 to be at a high level during the operative period of the sense amplifiers 1 and 10, the output of the three-state output circuit 17 can surely be set to a high-impedance state. When the output of the three-state output circuit 17 is in a high-impedance state, a large amount of current is prevented from passing through the transistors of the three-state output circuit 17 from the power source to the ground.

When a noise causes the actuating signal SE to be at a low level during the operative period of the sense amplifiers 1 and 10, the pull-up transistors $Q_{10}$ and $Q_{11}$ are turned ON. When the pull-up transistors $Q_{10}$ and $Q_{11}$ are turned ON, both the sense amplifier output lines 6 and 60 are at a high level, whereby the output of the three-state output circuit 17 is surely set to a high-impedance state.

As a result, when the sense amplifiers 1 and 10 are at the nonselected state, the output of the three-state output circuit 17 which is a sense amplifier buffer can automatically be set to a high-impedance state. In this way, the fourth embodiment having a feature which is obtained by combining the first and second embodiments can operate in a further stabilized manner against noise. Namely, the stabilized operation is further realized by the features of the first and second embodiment. Therefore, in the fourth embodiment, even if a noise is generated in the actuating signal SE and the data is erroneously read out from the memory cell, the output of the output circuit 17 is in the high-impedance state and the output circuit 17 does not output incorrect data.

As described above, according to the signal amplifying device of the invention, even when a noise produces an abnormal state in a signal input into or output from a sense amplifier, it is very seldom that a current flows through the transistors in the output circuit from the power source to the ground and the output circuit outputs incorrect data. In other words, the situation that all of the plurality of transistors having continuity in accordance with a combination of logical levels of the actuating signal and the signals from the sense amplifier output lines does not occur. Therefore, in the normal use of the signal amplifying device, the output circuit does not output incorrect data.

In the embodiments described above, the signal amplifying device of this invention is described as a device for DRAM, and data stored in DRAM is inputted to the device through bit lines. However, the signal amplifying device of this invention can be also used for SRAM, and in this case, data stored in SRAM may be input into the device through data lines or common lines.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A signal amplifying device comprising:

a sense amplifier for receiving first and second signals having respective logical levels from memory means, and for, when activated in response to an active signal, outputting third and fourth signals having respective logical levels in accordance with the logical levels of the first and second signals; and output means comprising an output terminal, first means and first, second, third and fourth transistors, each of said first, second, third and fourth transistors having a drain, a source and a gate, for outputting an output signal having one of a first level and a second level based on said third and fourth signals and said active signal;

wherein said source of said first transistor is connected to said drain of said second transistor, said source of said second transistor is connected to said output terminal and said drain of said third transistor, and said source of said third transistor is connected to said drain of said fourth transistor;

said first means receives said active signal, and said third and fourth signals, and generates fifth and sixth signals having one of a first level and a second level based on said active signal, said third signal and said fourth signal;

said gates of said first and third transistors receive said fifth signal and said gates of said second and fourth transistors receive said sixth signal;

said first and fourth transistors are turned off in order to set said output terminal of said output means to a high-impedance state when said fifth signal is at one level and said sixth signal is at the other level of said first and second levels;

said output signal is output from said output terminal when a level of said fifth signal is the same as a level of said sixth signal;

a level of said output signal is different from said level of said fifth signal; and said output signal has either a high logical level or a low logical level.

2. A signal amplifying device according to claim 1, wherein said output means sets the output terminal of said output means to a logical high state, a logical low state, or a high-impedance state in accordance with a combination of logical levels of said active signal, and said third and fourth signals.

3. A signal amplifying device according to claim 2, wherein said output means sets the output terminal of said output means to a logical high state or a logical low state, when said active signal is input and the logical level of said third signal is different from the logical level of said fourth signal, and sets the output terminal of said output means to a high-impedance state, when said active signal is input a low logical level and the logical level of said third signal is identical with the logical level of said fourth signal.

4. A signal amplifying device:

a sense amplifier for receiving first and second signals having respective logical levels from memory means, and for, when activated in response to an active signal, outputting third and fourth signals having respective logical levels in accordance with the logical levels of the first and second signals; and output means for receiving the active signal, and said third and fourth signals, said output means setting an output of said output means to a high-impedance state when said sense amplifier is not activated and for outputting an output signal having a logical level in accordance with a combination of said active signal and the logical levels of said third and fourth signals wherein said output means comprises:

a first inverter for receiving said third signal, inverting said logical level of said third signal when said level of said third signal is larger than a threshold level, and outputting a first inverted signal;

a nand element for receiving said first inverted signal and said active signal, and outputting a fifth signal having a logical level in accordance with a combination of said first inverted signal and said active signal;

a second inverter for receiving said active signal, inverting said logical level of said active signal when said level of said active signal is larger than a threshold level, and outputting a second inverted signal;

an element for receiving said fourth signal, and outputting said fourth signal when said level of said fourth signal is larger than a threshold level; and a nor element for receiving said second inverted signal and said fourth signal from said element, and outputting a sixth signal having a logical level in accordance with a combination of said second inverted signal and said fourth signal from said element.

5. A signal amplifying device according to claim 4 wherein said first and second signal said sense amplifier are connected to the memory means through a pair of signal lines and said signal amplifying device further comprises a pair of load means respectively connected between each one of said pair of signal lines and a power source.

6. A signal amplifying device according to claim 1 wherein said signal amplifying device further comprising pull-up means comprising fifth and sixth transistors, each of said fifth and sixth transistors having a drain, a source and a gate, said source of said fifth transistor connected to said first means, said source of said sixth transistor connected to said first means, said drain of fifth and sixth transistors connected to a power source, said gates of said fifth and sixth transistors receiving said active signal, said fifth and sixth transistors setting said third and fourth signals to a high logical level when said sense amplifier is in a deactivated state; and when levels of both third and fourth signals are at said high level, said output means sets said output terminal to a high impedance.

* * * * *